(12) United States Patent
Bhalwankar et al.

(10) Patent No.: US 11,204,396 B2
(45) Date of Patent: Dec. 21, 2021

(54) ELECTRICAL SYSTEM

(71) Applicant: Eaton Intelligent Power Limited, Dublin (IE)

(72) Inventors: Chaitanya Bhalwankar, Kothrud Pune (IN); Birger Pahl, Milwaukee, WI (US); Steve Schmalz, Franklin, WI (US); Galen Chui, Ladera Ranch, CA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/437,527

(22) Filed: Jun. 11, 2019

(65) Prior Publication Data
US 2019/0377020 A1    Dec. 12, 2019

(30) Foreign Application Priority Data

Jun. 12, 2018  (IN) .............................. 201811021984
Jun. 12, 2018  (IN) .............................. 201811021985

(51) Int. Cl.
*G01R 31/52*     (2020.01)
*G01R 15/20*     (2006.01)
*H02H 1/00*      (2006.01)

(52) U.S. Cl.
CPC ........... *G01R 31/52* (2020.01); *G01R 15/202* (2013.01); *H02H 1/0007* (2013.01)

(58) Field of Classification Search
CPC .......... H02H 1/0015; H02H 3/33; H02H 3/14; H02H 1/0092
See application file for complete search history.

(56) References Cited

U.S. PATENT DOCUMENTS

| | | |
|---|---|---|
| 3,879,639 A | 4/1975 | Sircom |
| 5,245,498 A | 9/1993 | Uchida et al. |
| 5,363,018 A | 11/1994 | Shackle |
| 5,691,643 A * | 11/1997 | Ishiguro ............... G01R 31/343 324/510 |
| 6,107,611 A | 8/2000 | Jones |
| 6,658,360 B1 | 12/2003 | Gies et al. |
| 7,164,273 B2 | 1/2007 | Bailey |
| 7,292,042 B2 | 11/2007 | Morita et al. |

(Continued)

FOREIGN PATENT DOCUMENTS

| | | |
|---|---|---|
| EP | 3582355 A1 | 12/2019 |
| WO | 2011/153581 | 12/2011 |

OTHER PUBLICATIONS

Copending U.S. Appl. No. 16/437,569 for "Electrical System", filed Jun. 11, 2019.

(Continued)

*Primary Examiner* — Rina I Duda
(74) *Attorney, Agent, or Firm* — Fishman Stewart PLLC

(57) ABSTRACT

A method of monitoring an electrical system may include providing a ground fault detection unit, operating a transformer rectifier unit to provide DC power to a load, sensing, via a current sensor, a ground current at or about an output of the transformer rectifier, and/or monitoring a sensor output from the current sensor via the ground fault detection circuit. The ground fault detection circuit may be configured to detect ground faults at frequencies of at least 30 kHz.

20 Claims, 22 Drawing Sheets

(56) References Cited

U.S. PATENT DOCUMENTS

| | | | |
|---|---|---|---|
| 7,423,854 B2* | 9/2008 | Gandolfi | H02H 3/14 361/42 |
| 7,791,353 B2* | 9/2010 | Bellan | G01R 31/50 324/529 |
| 8,023,235 B2* | 9/2011 | Bilac | H02H 1/0015 324/500 |
| 8,081,001 B2* | 12/2011 | Hooper | H02H 3/335 324/509 |
| 8,218,274 B2 | 7/2012 | Hastings et al. | |
| 8,593,150 B2* | 11/2013 | Vrankovic | G01R 31/50 324/509 |
| 8,841,917 B2* | 9/2014 | Wei | H02M 5/458 324/509 |
| 9,142,955 B2 | 9/2015 | Wang et al. | |
| 9,411,003 B2 | 8/2016 | Danesh et al. | |
| 9,413,162 B2 | 8/2016 | Brouwer et al. | |
| 9,612,267 B2 | 4/2017 | Kolker et al. | |
| 9,768,605 B2 | 9/2017 | Kolker et al. | |
| 9,797,940 B2 | 10/2017 | Kolker et al. | |
| 9,797,941 B2 | 10/2017 | Kolker et al. | |
| 9,933,463 B2 | 4/2018 | Danesh et al. | |
| 10,564,207 B2 | 2/2020 | Tallam et al. | |
| 10,569,895 B2 | 2/2020 | Handy | |
| 2015/0103447 A1 | 4/2015 | Brouwer et al. | |
| 2017/0110873 A1 | 4/2017 | Glovinski et al. | |
| 2017/0117699 A1 | 4/2017 | Ostrovsky et al. | |
| 2017/0131340 A1 | 5/2017 | Tallam et al. | |
| 2018/0134408 A1 | 5/2018 | Handy | |
| 2018/0375505 A1 | 12/2018 | Handy et al. | |
| 2019/0377020 A1 | 12/2019 | Bhalwankar et al. | |
| 2019/0377021 A1 | 12/2019 | Bhalwankar et al. | |
| 2020/0041559 A1 | 2/2020 | Tallam et al. | |
| 2020/0182921 A1 | 6/2020 | Jakupi et al. | |

OTHER PUBLICATIONS

Euopean Search Report, EP19179835, dated Oct. 25, 2019.
Allegro Microsystems et al.; "ACS714. Automotive Grade, Fully Intergrated, Hall Effect-Based Liner Current Sensor IC with 2.1 kVRMS Voltage Isolation and a Low-Resistance current Conductor", Nov. 16, 2012 (Nov. 16, 2012), XP055635884 , 115 Northeast Cutoff, Box 15036 Worcester, Massachusetts Retrieved from the internet: URL:https://www.pololu.com/file/0J196/ACS714.pdf [retrieved on Oct. 25, 2019] *3 pages*.
Euopean Search Report, EP19179837, dated Oct. 28, 2019.
European Office Action, 19179837.0, dated Jul. 30, 2021.

\* cited by examiner

ELECTRICAL SYSTEM

CROSS-REFERENCE TO RELATED APPLICATIONS

This application claims the benefit of India Provisional Patent Application Serial No. 201811021984, filed on Jun. 12, 2018, and India Provisional Patent Application Serial No. 201811021985, filed on Jun. 12, 2018, the disclosures of which are hereby incorporated herein by reference in their entireties.

TECHNICAL FIELD

The present disclosure generally relates to electrical systems, including ground fault detection systems that may be configured for wideband ground fault detection for high voltage direct current (DC), high voltage alternating current (AC), and/or high frequency switching currents.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Electrical systems may continue to use higher voltages and/or higher currents, which may involve changes to existing systems. For example and without limitation, the increase in onboard electrical power generation (e.g., of aircraft) has resulted in significant changes to electrical power system architectures to ensure efficiency benefits of electrical loads are not mitigated. Higher voltage levels may enable more distributed architectures. Variable frequency AC and DC sections may be used, or more extensively used, in aircraft electrical networks/systems that may be critical to the operation of the aircraft. PWM (pulse width modulation) converters and battery-based architectures may involve DC/DC converters, DC/AC motor drives, AC/DC chargers or power converters, and/or other components operating with high frequencies (e.g., PWM, switching, etc.), such as for achieving higher power density, lower weight, and increased efficiency. Such high frequency components may cause noise and/or result capacitive coupling, such as due to fundamental and harmonic frequencies.

High voltages and/or high frequencies may be utilized, and the risk of a ground fault may be increased relative to systems utilizing lower voltages and/or lower frequencies. It may be desirable for an electrical system, such as an aircraft electrical system, to include an electrical protection/detection system. An electrical protection/detection system may detect and appropriately respond to faults, such that (in the worst-case scenario) an aircraft is able to land safely after an electrical fault has occurred.

Existing ground fault detection (GFD) devices, such as those that may be used in connection with aircraft, may only be intended for 115 VAC, 360 Hz to 800 Hz. Newer aircraft electrical systems may be "More Electric Aircraft" (MEA) systems and/or fully electric systems, which may involve electrical systems utilizing higher nominal voltages, and/or frequencies such as, for example and without limitation, 230 VAC, +/−270 VDC, and/or +/−540 VDC, with frequencies that may be on the order of several kilohertz to tens of megahertz, or higher. The chances of a ground fault occurrence with high voltage and high current systems may be more prominent than with lower voltage and current systems that may be used in conventional electrical/aircraft systems. Carbon composite aircrafts (CFRP) may be vulnerable to arcing and ground faults. Also, high frequency motor drives may introduce high frequency ground faults and DC ground faults that may not be an issue for existing designs. Also, a DC ground fault can saturate some conventional current measurement systems.

There is a desire for solutions/options that minimize or eliminate one or more challenges or shortcomings of electrical systems. The foregoing discussion is intended only to illustrate examples of the present field and should not be taken as a disavowal of scope.

SUMMARY

In embodiments, a method of monitoring an electrical system may include providing a ground fault detection unit, operating a transformer rectifier unit to provide DC power to a load, sensing, via a current sensor, a ground current at or about an output of the transformer rectifier, and/or monitoring a sensor output from the current sensor via the ground fault detection circuit. The ground fault detection circuit may be configured to detect ground faults at frequencies of at least 30 kHz. The ground fault detection unit may be configured to detect ground faults at frequencies of at least 100 kHz. The method may include sensing, via a second current sensor, the ground current. The current sensor may be configured as a high-frequency current sensor and the second current sensor is a low-frequency current sensor. The current sensor may not be a Hall Effect sensor. The second current sensor may be a Hall Effect sensor. Monitoring the sensor output may include monitoring the sensor output over a period of time. The period of time may be at least one hour. The method may include detecting a ground fault if the ground current exceeds a first threshold or a second threshold. The first threshold may be a low frequency current threshold and the second threshold may be a high frequency current threshold. The second threshold may be lower than the first threshold. Detecting the ground fault may include detecting the ground fault if the ground current exceeds the first threshold for a first period of time or if the ground current exceeds the second threshold for a second period of time. The second period of time may be longer than the first period of time. The ground fault may correspond to ground current with a frequency of at least 25 kHz. Detecting the ground fault may include detecting the ground fault without a Fourier transform.

With embodiments, an electrical system may include a ground fault detection unit, including a first ground fault detection circuit and/or a second ground fault detection circuit. The first ground fault detection circuit may include a first portion and a second portion. The first portion and the second portion may be connected to a first current sensor. The second ground fault detection circuit may include a first portion and a second portion. The first portion and the second portion may be connected to a second current sensor. The first current sensor and the second current sensor may be configured to sense current at or about an output of a DC power supply. The first portion of the first ground fault detection circuit may include a low pass filter having a cutoff frequency. The second portion of the first ground fault detection circuit may include a first bandpass filter with a first passband. The first portion of the second ground fault detection circuit may include a second bandpass filter with a second passband; and the second portion of the second ground fault detection circuit may include a third bandpass filter with a third passband. The third passband may include higher frequencies than the second passband. The second passband may include higher frequencies than the first passband. The first passband may include frequencies above the cutoff frequency.

In embodiments, the DC power supply may include a transformer rectifier unit. The first passband may correspond to the DC power supply. The second passband may correspond to switching frequencies. The third passband may correspond to harmonics of the switching frequencies. A maximum frequency of the third passband may be at least about 100 kHz and a maximum frequency of the second passband may be at least about 20 kHz. A maximum frequency of the second passband may be at least about 4 kHz. The cutoff frequency may be about 10 Hz or less. The first portion of the second ground fault detection circuit may include a demodulator configured to reduce a frequency of an output of the second current sensor. The first portion of the first ground fault detection circuit may include a monostable multivibrator.

With embodiments, an electrical system may include a second ground fault detection unit including a third ground fault detection circuit and a fourth ground fault detection circuit. The second ground fault detection unit may be connected to an AC power supply. The DC power supply may be connected to the AC power supply and may be configured to convert AC power from the AC power supply to DC power for a variable frequency drive connected to an electric motor.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
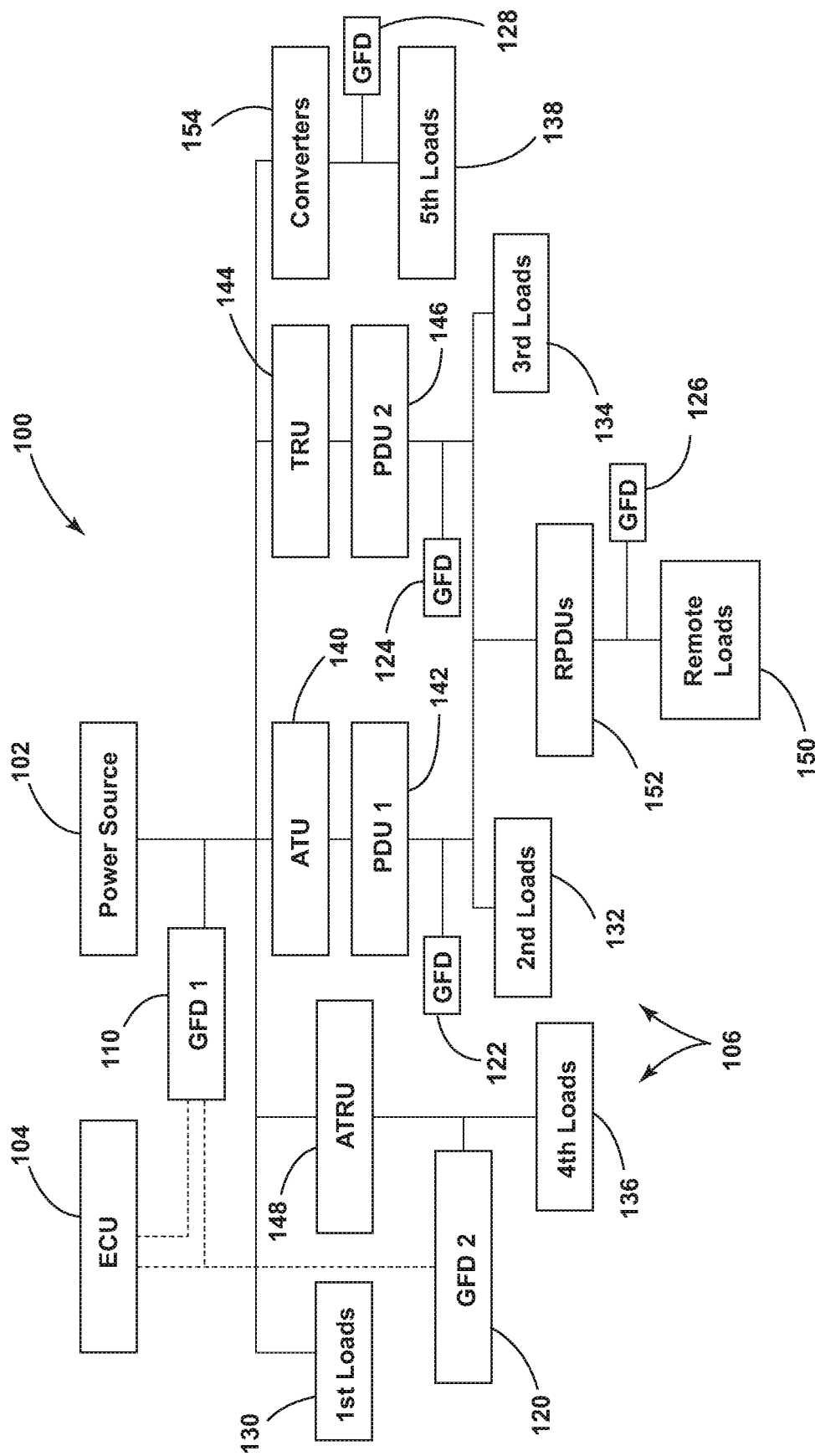
FIG. 1 is a schematic view generally illustrating an embodiment of an electrical system according to teachings of the present disclosure.

In embodiments, such as generally illustrated in FIG. 1, an electrical system 100 may include a power source 102, an electronic control unit (ECU) 104, a plurality of loads 106, a first ground fault detection (GFD) unit 110, a second GFD unit 120, and one or more additional GFD units (e.g., GFD units 122, 124, 126, 128). Additional GFD units 122, 124, 126, 128 may be configured in the same or a similar manner as GFD units 110, 120, as appropriate. Two or more of the GFD units 110, 120, 122, 124, 126, 128 may be configured to communicate with each other. The power source 102 may be connected directly to one or more loads (e.g., first loads 130) and/or the power source 102 may be connected indirectly connected to one or more loads, (e.g., second loads 132, third loads 134, fourth loads 136, and/or fifth loads 138), such as via transformers and/or power distribution units. For example and without limitation, the power source 102 may be connected to one or more second loads 132 via an auto-transformer unit (ATU) 140 and/or a first power distribution unit (PDU) 142; the power source 102 may be connected to one or more third loads 134 via a transformer rectifier unit (TRU) 144 and/or a second PDU 146; the power source 102 may be connected to one or more fourth loads 136 via an auto-transformer rectifier unit (ATRU) 148; the power source 102 may be connected to one or more remote loads 150 via one or more remote power distribution units (RPDUs) 152, which may be connected to the power source 102 via the power distribution units 142, 146, the ATU 140, and/or the TRU 144; and/or the power source 102 may be connected to one or more fifth loads 138 via one or more converters 154, which may include DC/DC converters, AC/AC converters, AC/DC converters, and/or DC/AC converters. One or more of the converters 154 may have a variable frequency and/or may introduce variable and/or high frequency components into the electrical system 100.

With embodiments, the power source 102 may be configured to provide AC power and/or DC power. The power source 102 may, for example and without limitation, include generators that may be connected to engines (e.g., aircraft engines) and/or an auxiliary power unit (APU), may include one more batteries, and/or may include other power sources.

In embodiments, the first loads 130 may include one or more of a variety of loads, such as, for example and without limitation, a wing ice protection system (WIPS), a hydraulic AC motor pump, fuel pumps, galley ovens, cargo heaters, and/or environmental control system (ECS) recirculation fans, among others. The first loads 130 may, for example, be configured to operate with about 230 VAC.

With embodiments, the second loads 132 may include one or more of a variety of loads, such as, for example and without limitation, ECS lavatory/galley fans, equipment cooling fans, and/or window heaters, among others. The second loads 132 may, for example, be configured to operate with about 115 VDC. An ATU 140 may be configured to convert power from the power source 102 (e.g., 230 VAC) to the operating voltage of the second loads 132 (e.g., 115 VDC) and/or the first PDU 142 may be configured to provide 115 VDC to the second loads 132.

In embodiments, the third loads 134 may include one or more of a variety of loads, such as, for example and without limitation, a DC fuel pump, igniters, a common core system (CCS), flight deck displays, a bus power control unit (BPCU), and/or a generator control unit (GCU), among others. The third loads 134 may be configured to operate with 28 VDC. The TRU 144 may be configured to convert power from the power source 102 (e.g., 230 VDC) to an operating voltage of the third loads 134, such as 28 VDC, and/or the second PDU 146 may be configured to provide the operating voltage to the third loads 134.

With embodiments, the fourth loads 136 may include one or more of a variety of loads, such as, for example and without limitation, adjustable speed motors that may be controlled via one or more controllers that may be connected to the ATRU. A controller may include a variable frequency generator/drive (VFD) for controlling an adjustable speed electric motor. The ATRU 148 may be configured to convert power from the power source 102 (e.g., 230 VAC) to an operating voltage of the fourth loads 136, such as 270 VDC.

Figure 2:
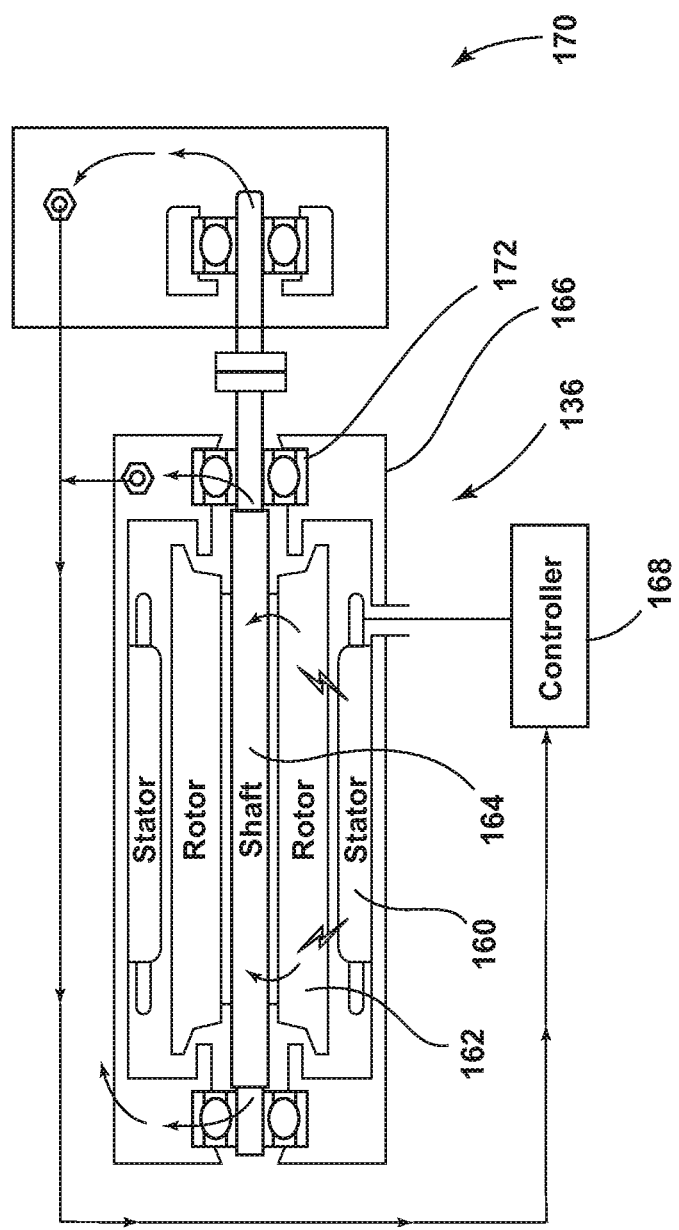
FIG. 2 is a schematic view generally illustrating portions of an embodiment of an electrical system according to teachings of the present disclosure.

In embodiments, such as generally illustrated in FIG. 2, a fourth load 136 (e.g., a motor) may include a stator 160, a rotor 162, a shaft 164, and/or a housing 166. A controller 168 may provide a control signal to the stator 160 to cause rotation of the rotor 162 and the shaft 164 to actuate a mechanical load 170. The frequency range of the controller 168 may, for example and without limitation, include a lower end of about 10 kHz and may include an upper end of about 50 kHz. As the shaft 164 rotates, some electrical current (e.g., high frequency current) may be transferred from the shaft 164 to the housing 166, such as via a bearing 172 (e.g., via capacitive and/or inductive coupling), and the housing 166 may be connected to ground, which may result in ground current. This ground current may be harmful to the electrical system 100. For example and without limitation, the ground current may cause physical damage, at least over time, to the bearing 172, which may result in bearing failure.

Figure 3:
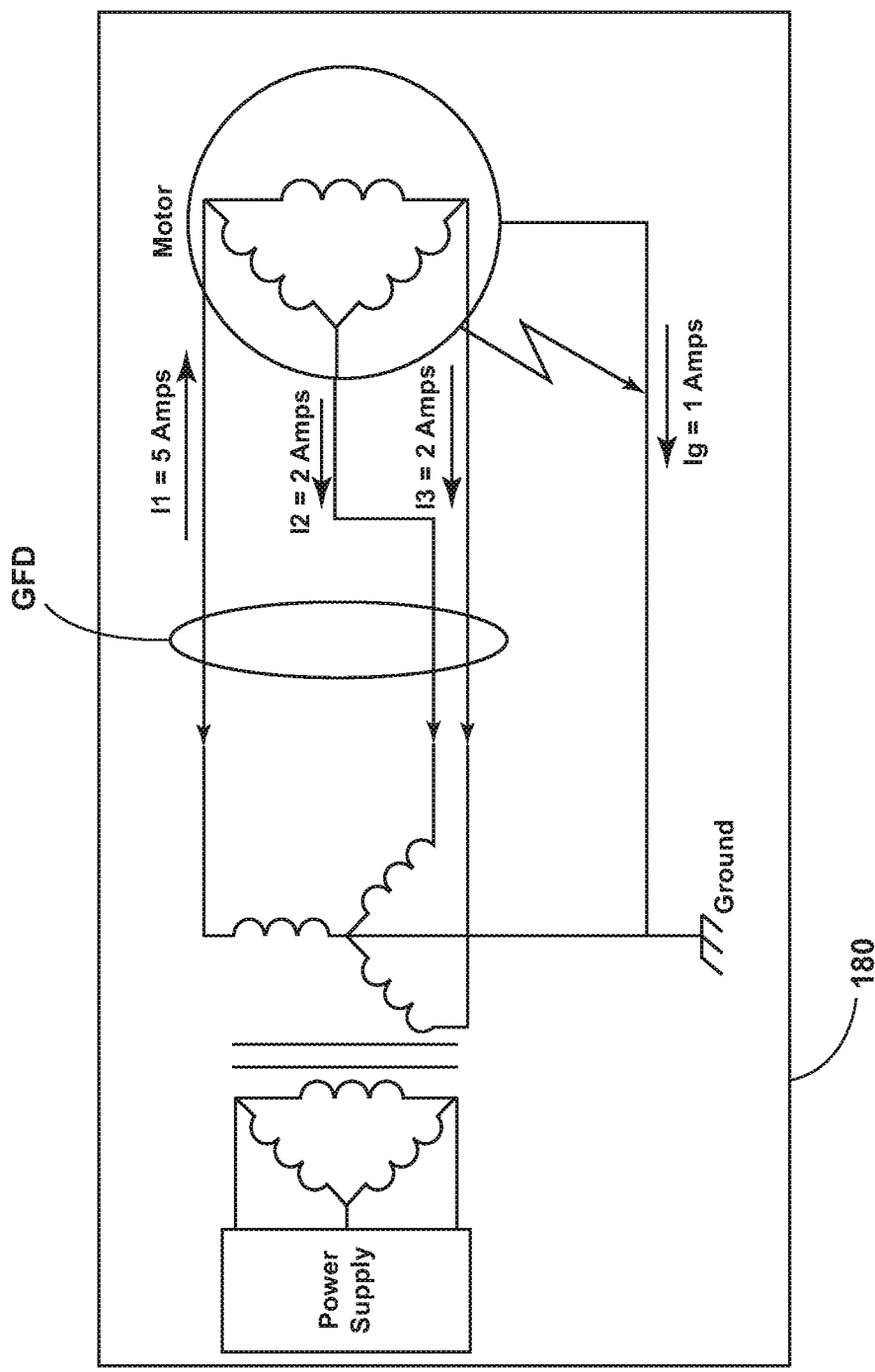
FIG. 3 is a schematic view generally illustrating an embodiment of a ground fault detector according to teachings of the present disclosure.
Figure 4:
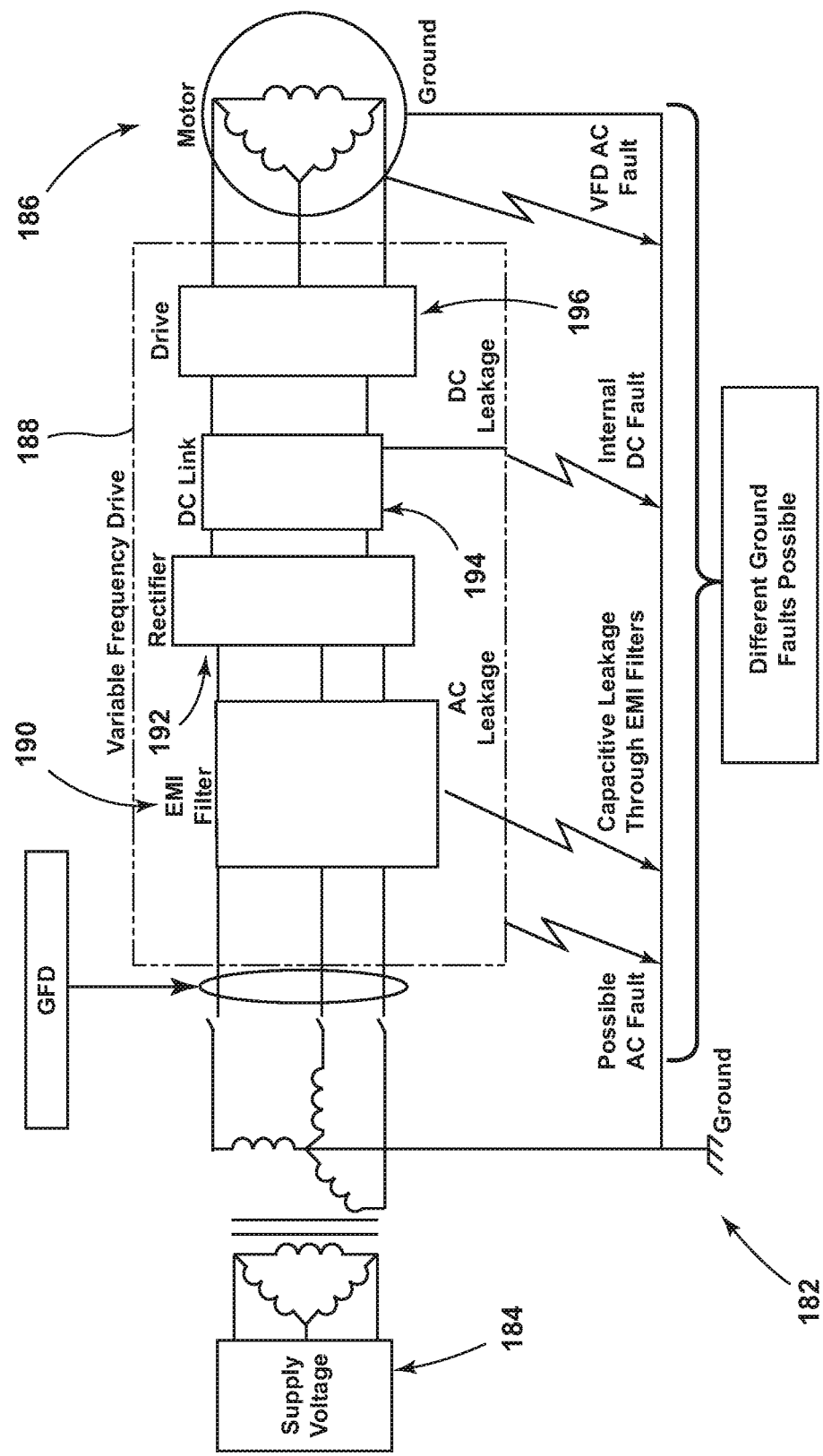
FIG. 4 is a schematic view generally illustrating portions of an embodiment of an electrical system, with a ground fault detector, according to teachings of the present disclosure.
Figure 5:
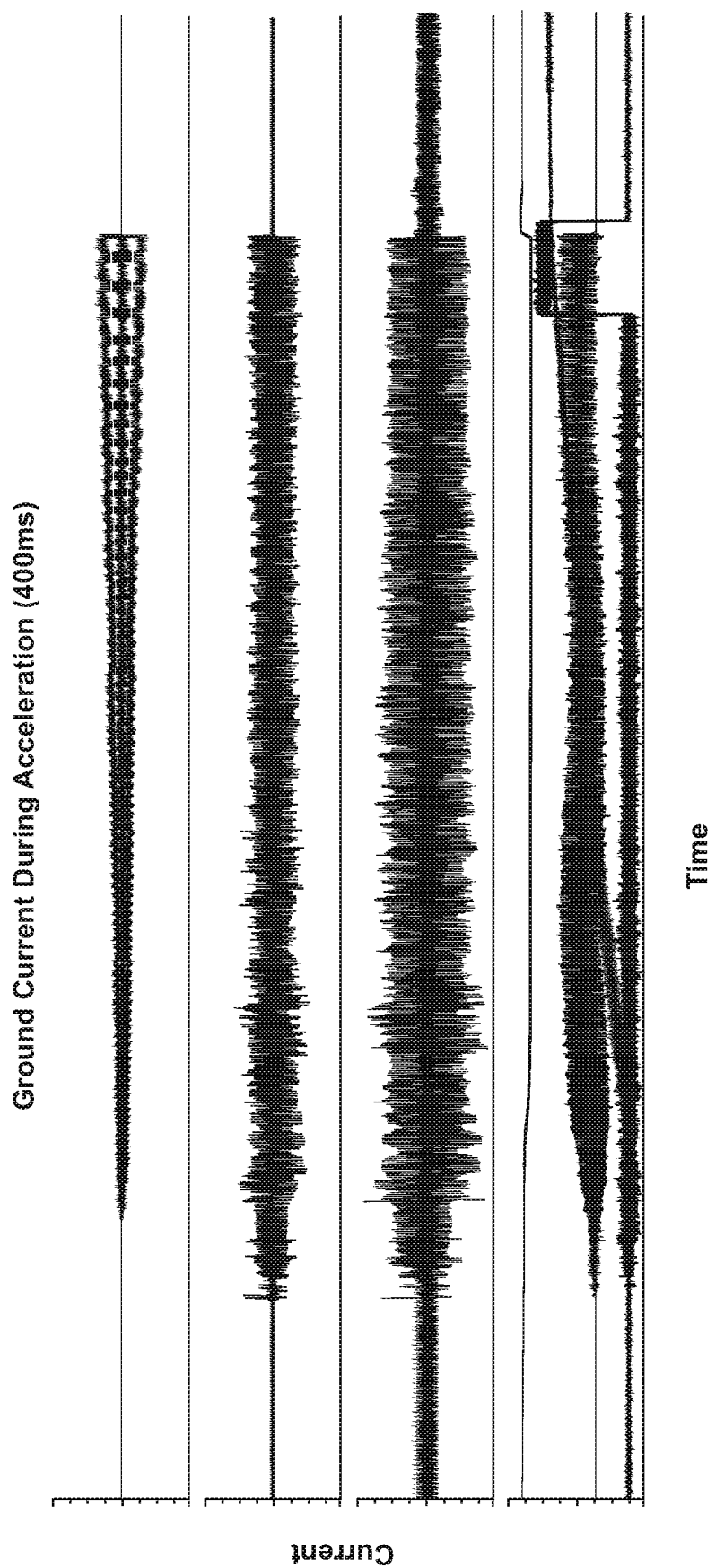
FIG. 5 is a graphical view of ground current in an embodiment of an electrical system according to teachings of the present disclosure.

Examples of ground fault detectors (GFDs) 180, 182 are generally illustrated in FIGS. 3 and 4. A GFD 180, 182 may be configured to detect ground current. For example and without limitation, a GFD 182 may be connected between a power supply 184 and a motor 186 and/or a controller/variable frequency drive (VFD) 188 (or PMSM or BLDC drives) associated with the motor 186. The VFD 188 may include an EMI (electromagnetic interference) filter 190, a rectifier 192, a DC link 194, and/or an IGBT (insulated-gate bipolar transistor) drive 196. The example systems 180, 182 may be based upon a summation of a common mode transformer. If the sum of I1, I2, and I3 is non-zero (e.g., Ig is non-zero), then depending upon a threshold of allowable ground current, the system may detect the ground fault (see, e.g., FIG. 3). As generally illustrated in FIG. 4, sources of ground current may include the EMI filter 190 and/or a DC link 194 of the VFD 188, and/or the motor 186, for example and without limitation. As generally illustrated in FIG. 5, if a motor 186 accelerates, the ground current associated with the motor 186 and/or the system may increase.

Figure 6:
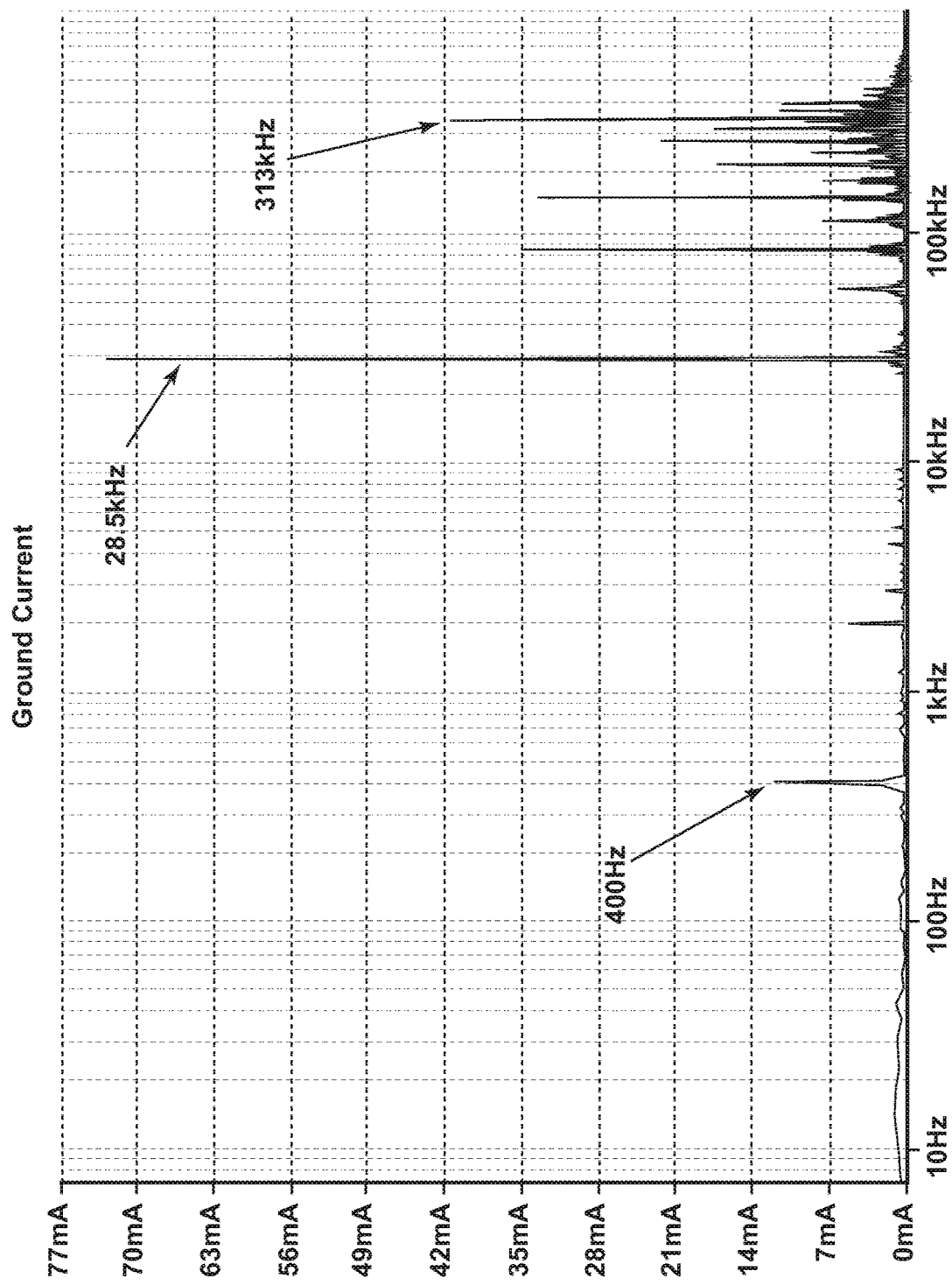
FIG. 6 is a graphical view of the frequencies of ground current in an embodiment of an electrical system according to teachings of the present disclosure.

With embodiments, such as generally illustrated in FIG. 6, ground current may include a plurality of frequencies. Some current sensors may be configured to sense current at relatively low frequencies, such as about 400 Hz or less, but such sensors may not effectively sense ground current at higher frequencies, such as, for example, frequencies of about 20 KHz to about 400 KHz or higher. In some circumstances, the noise content (e.g., spectral noise) of AC GF currents above 2 A in the region of 100 kHz may be of the order of 50 dBµA (300 µA) and at 2 MHz may be of the order of 20 dBµA (10 µA). Conventional sensors may not offer this wide dynamic range. Noise content may be measured in an impedance-controlled test setup using a spectrum analyzer and an RF current probe.

Figure 7:
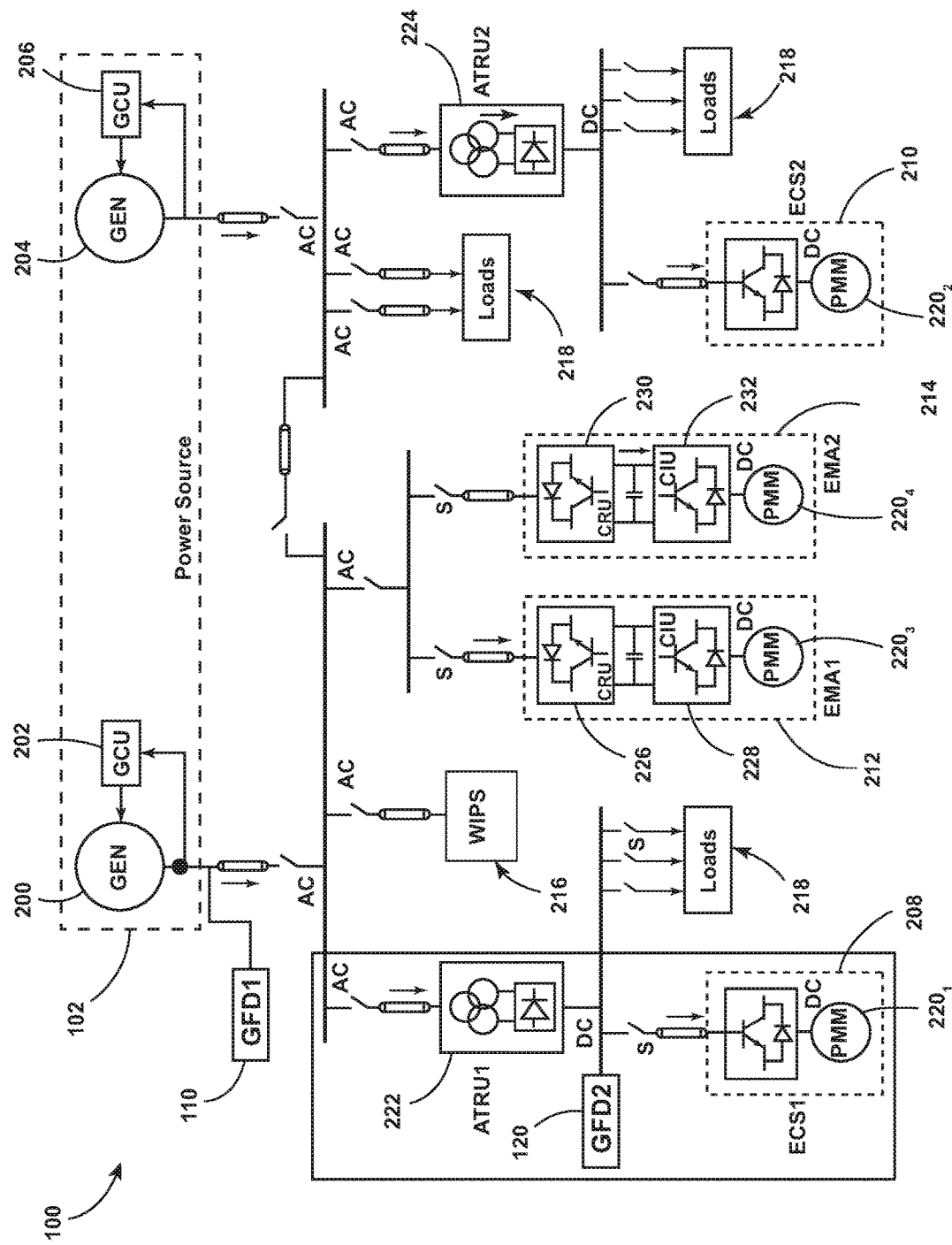
FIG. 7 is a schematic view generally illustrating portions of an embodiment of an electrical system according to teachings of the present disclosure.

FIG. 7 generally illustrates portions of an embodiment of an electrical system 100, which may be configured as an MEA power distribution system. An electrical system 100 may include a power source 102 that may include a first generator 200, a first generator controller 202, a second generator 204, and/or a second generator controller 206. The power source 102 may be configured to provide power to one or more loads, such as a first electronic climate system (ECS) 208, a second ECS 210, a first electromechanical actuator (EMA) 212, a second EMA 214, a wing ice protection system (WIPS) 216, and/or one or more other loads 218. The first ECS 208, the second ECS 210, the first EMA 212, and/or the second EMA 214 may include a motor 2201, 2202, 2203, 2204, such as a permanent magnet motor (PMM). A first ATRU 222 may be connected between the power source 102 and the first ECS 208. A second ATRU 224 may be connected between the power source 102 and the second ECS 210. The first EMA 212 may include a first controlled rectifier unit (CRU) 226 and/or a first controlled inverter unit (CIU) 228. The second EMA 214 may include a second CRU 230 and/or a second CIU 232. A breaker, generally designated with S, may be disposed at some or all junctions. A circuit breaker S at the power source 102 or at the load side may be capable of dealing with (e.g., detecting) at least some ground faults, such as lower frequency ground faults.

With embodiments, an ATRU 222, 224 may create a frequency component that may be different than the power source 102. For example and without limitation, the frequency component associated with an ATRU may be about 12 times the frequency of the power source 102. Isolation may not be available for an ATRU 222, 224. Additionally or alternatively, CRUs 226, 230 may create switching frequency noise. Embodiments of electrical systems 100 may incorporate and/or be configured to implement design techniques and solutions to limit damage from ground faults.

In embodiments, a plurality of primary energy bands (e.g., four primary energy bands) may be identified as likely to indicate/reflect a ground fault. The bands may be identified by statistical analysis. A first band may, for example and without limitation, include about 0 Hz to about 1 KHz, such as about 0 Hz to about 10 Hz (e.g., for DC current) and/or about 300 Hz to about 900 Hz (e.g., for AC current). The first band may include significant low frequency (LF) GF energy and/or may include the aircraft supply frequency band, which may be about 400 Hz. A second frequency band may, for example and without limitation, include about 4 kHz to about 10 kHz. The TRU/ATRU and AC leakages on a secondary transformer may be present in the second band. A third frequency band may, for example and without limitation, include about 20 kHz to about 50 kHz. Ground currents due to switching frequency may be present in the third band. A fourth band may, for example and without limitation, include about 150 kHz to 400 kHz. The fourth band may include harmonics of switching frequencies. It may be possible to tune these bands to another set of frequencies. If information about the switching characteristics of the load side equipment is available, such information can be entered (e.g., into an ECU 104) using user programmable inputs, which may facilitate tuning of these bands (e.g., for ground fault detection units 110, 120) and avoid/limit nuisance tripping. Sensing directly at these harmonics may facilitate detecting ground faults. If such information is not available, then default settings can be used. In embodiments, an ECU 104, a first GFD unit 110, and/or a second GFD unit 120 of an electrical system 100 may extract/evaluate some or all of these wideband GF characteristics and may make a decision to trip (e.g., open a circuit, disconnect a component, etc.).

Utilizing a single current sensor (CS) to cover low frequency (LF) and high frequency (HF) fault current components may not be practical in some circumstances. In embodiments, an electrical system 100 may include two current probes/sensors, such as an LF current sensor 236 and an HF current sensor 238. An electrical system 100 may include one or more LF current sensors 236, which may include Hall Effect sensors. An electrical system 100 may include one or more HF current sensors 238, which may include toroidal transformers. Additionally or alternatively, an HF current sensor 238 may include a single current shunt or wide band current transformer that may be followed by different active or passive band selective filters (e.g., in a GFD unit 110, 120). For low frequency current, an LF current sensor 236 may include a common mode choke/hall probe may be utilized to detect 0 Hz to 1 kHz output signals (e.g., 0 Hz to 10 Hz, 300 Hz to 900 Hz, etc.) which may be further analyzed by a GFD unit 110, 120 and/or an electronic control unit 104, such as to determine the presence of a ground fault. The GFD unit 110, 120 and/or the ECU 104 may utilize a built-in method that may compare parameters of incoming signals against threshold values. These thresholds may, for example and without limitation, be programmed in real-time using digital potentiometers and/or may be preset.

Figure 8:
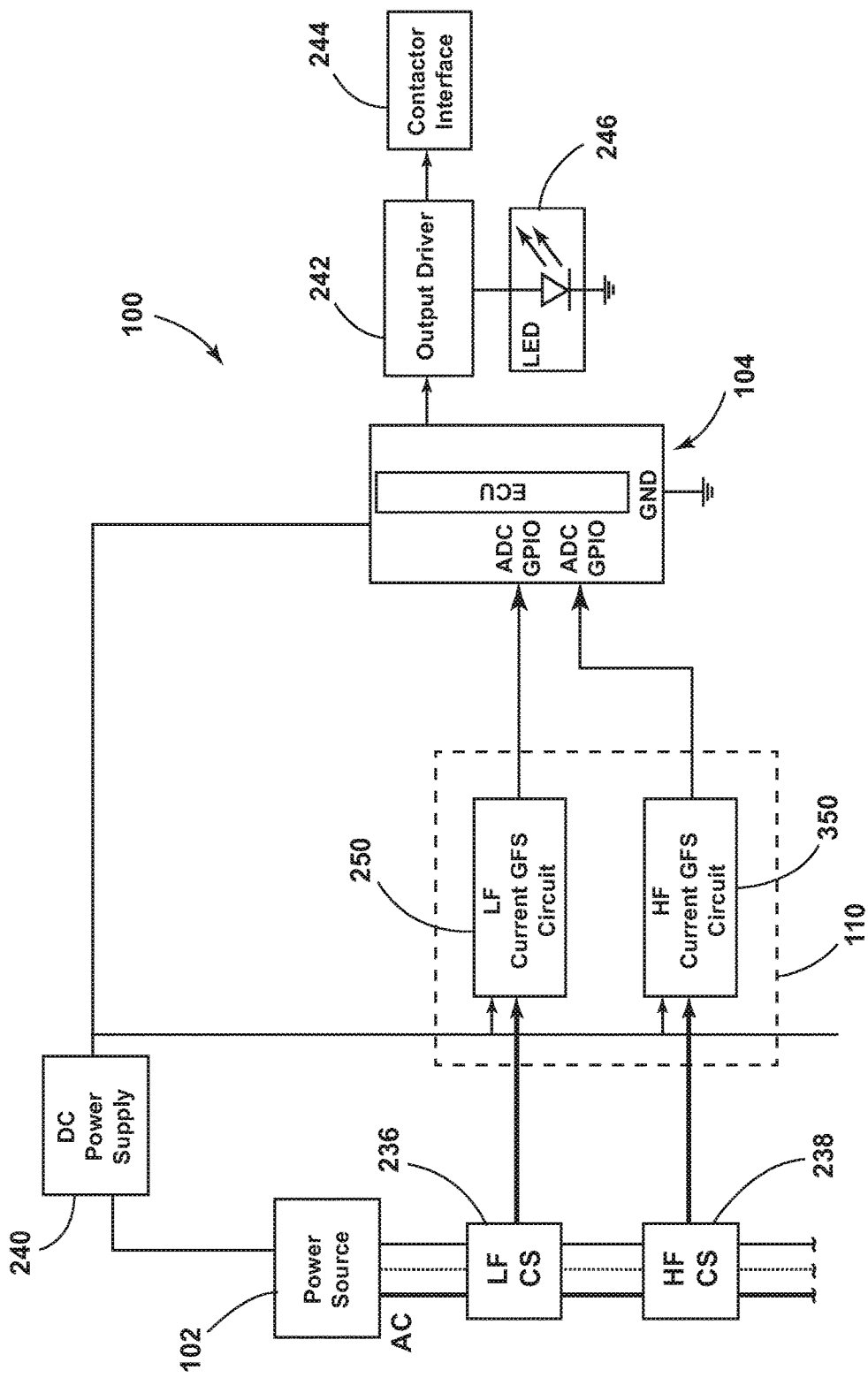
FIG. 8 is a schematic view generally illustrating portions of an embodiment of an electrical system, including a low frequency ground fault detection circuit and a high frequency detection circuit, according to teachings of the present disclosure.
Figure 9:
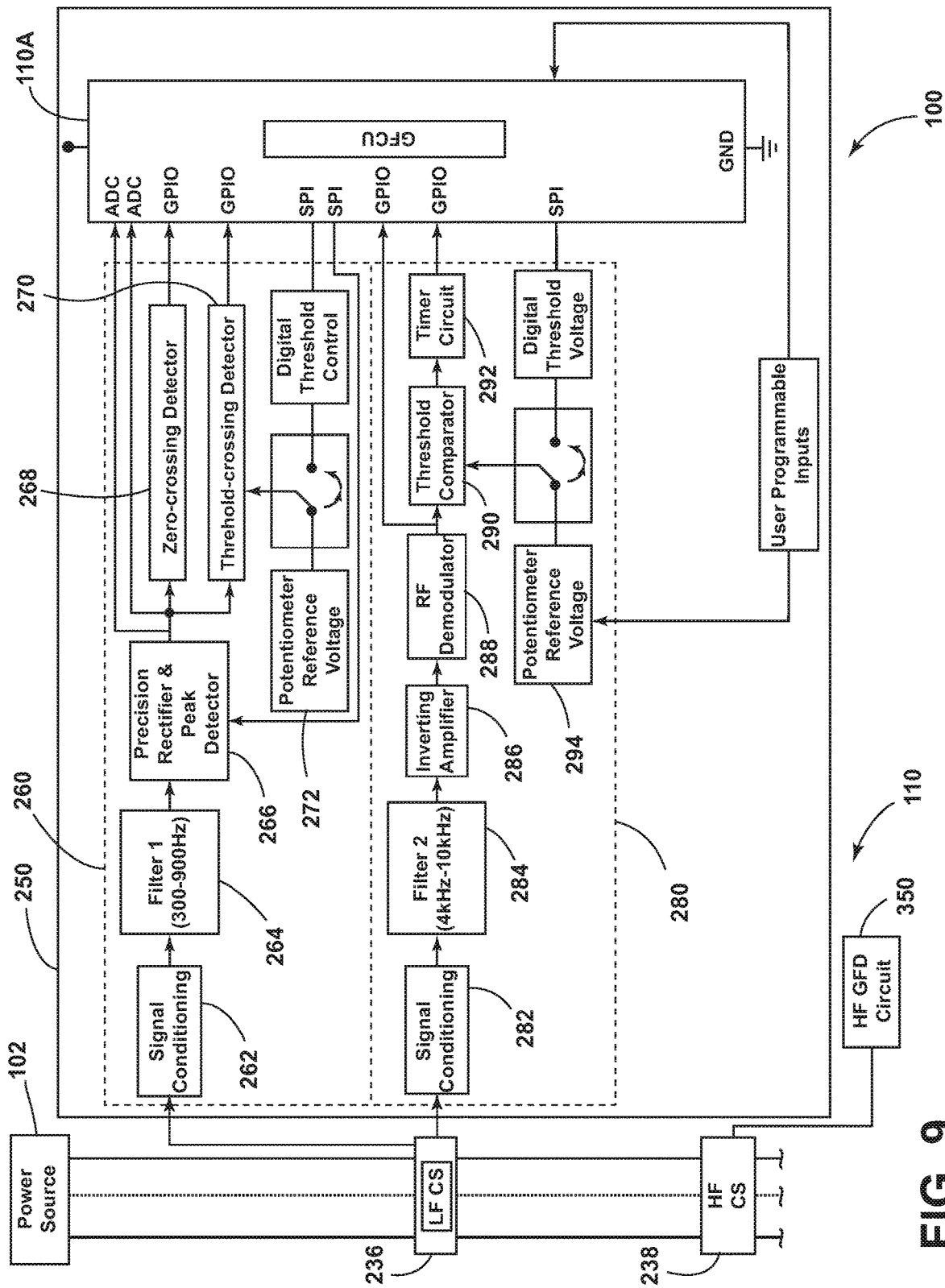
FIG. 9 is a schematic view generally illustrating portions of an embodiment of an electrical system including a low frequency ground fault detection circuit according to teachings of the present disclosure.
Figure 10:
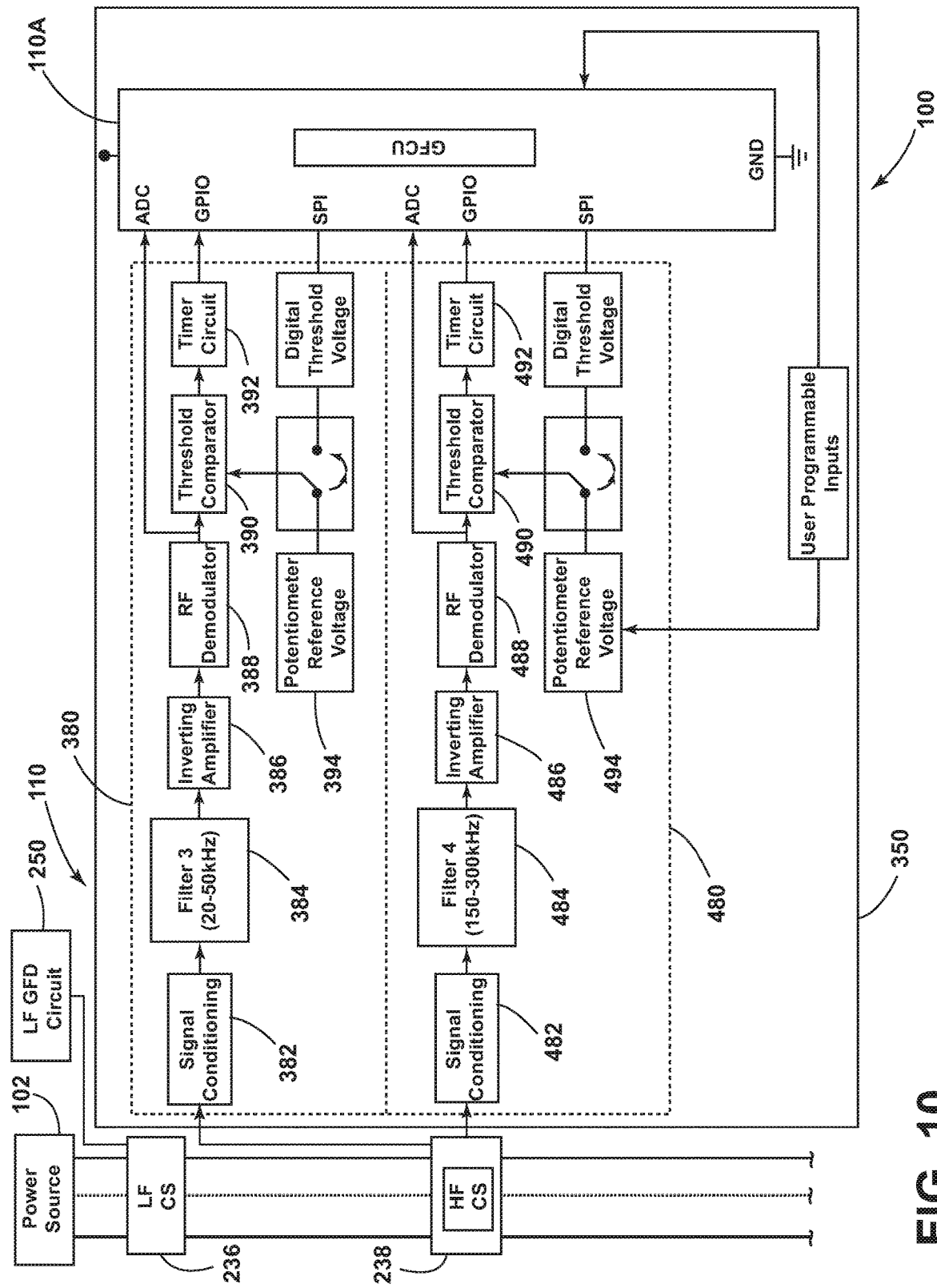
FIG. 10 is a schematic view generally illustrating portions of an embodiment of an electrical system including a high frequency ground fault detection circuit according to teachings of the present disclosure.

An embodiment of an electrical system 100 that may be configured for ground fault detection is generally illustrated in FIG. 8. The electrical system 100 may include a first GFD unit 110, a DC power supply 240, an ECU 104, output drivers 242, and/or one or more outputs, such as a contactor interface 244 and/or one or more LEDs (light emitting diodes) 246, for example and without limitation. The DC power supply 240 may provide power to the first GFD unit 110 and/or the ECU 104. The ECU 104 may be connected to and/or configured to control the first GFD unit 110 and/or the output drivers 242. The output drivers 242 may drive the outputs 244, 246. The first GFD unit 110 may include a microcontroller unit (GFCU) 110A, an LF GFD circuit 250 and/or an HF GFD circuit 350. An embodiment of an LF GFD circuit 250 is generally illustrated in FIG. 9. An embodiment of an HF GFD circuit 350 is generally illustrated in FIG. 10.

With embodiments, such as generally illustrated in FIG. 9, an LF GFD circuit 250 may include a first portion 260 and/or a second portion 280, which may be connected to the GFCU 110A. The first portion 260 may be configured to detect ground faults in a first range of frequencies, such as about 300 Hz to about 900 Hz. The second portion 280 may be configured to detect ground faults in a second range of frequencies, such as about 4 KHz to about 10 KHz.

In embodiments, the first portion 260 may include signal conditioning circuitry 262, a filter 264, a rectifier and peak detector 266 (e.g., a precision rectifier and peak detector), a zero-crossing detector 268, and/or a threshold-crossing detector 270. An LF current sensor 236 may be connected at or about an output of the power source 102 (e.g., connected to sense the current(s) of the output signal(s) of the power source 102). An output of the LF current sensor 236 may be connected to the signal conditioning circuitry 262. An output of the signal conditioning circuitry 262 may be connected to the filter 264. The filter 264 may be configured as a bandpass filter that may include a first passband. The first passband may, for example and without limitation, include about 300 Hz to about 900 Hz. An output of the filter 264 may be connected to the rectifier and peak detector 266. An output of the rectifier and peak detector 266 may be connected to the GFCU 110A, the zero-crossing detector 268, and/or the threshold-crossing detector 270. An output of the zero-crossing detector 268 and/or an output of the threshold-crossing detector 270 may be connected to the GFCU 110A. The threshold-crossing detector 270 may compare the output of the rectifier and peak detector 266 to a threshold and the output of the comparison may be transferred to an input port of the GFCU 110A. A signal transition on this input port may indicate that current has crossed the ground threshold and further action may be initiated by the GFCU 110A (e.g., disconnection, shut down, etc.). The peak of the rectified signal may be held substantially constant for a specific duration and may be read by the GFCU 110A. The GFCU 110A may then discharge the peak detector 266. The GFCU 110A may process this information and may determine if the content of the first portion 260 of LF GFD circuit 250 indicates the presence of a ground fault. For example and without limitation, the GFCU 110A may use results of comparisons to increase or decrease the number of events recorded by a counter, and the presence of a fault may be established when the number of counts reaches the predetermined threshold value, such as within a selected sliding time window.

In embodiments, the GFCU 110A may be configured to receive an input (e.g., user input) to set a threshold of the threshold-crossing detector 270. The GFCU 110A may set the threshold according to the input. Additionally or alternatively, a default threshold may be provided, such as via a potentiometer 272.

With embodiments, the second portion 280 of the LF GFD circuit 250 may include signal conditioning circuitry 282, a filter 284, an inverting amplifier 286, a demodulator 288 (e.g., a radio frequency or RF demodulator), a threshold comparator 290, and/or a timer circuit 292. An output of the LF current sensor 236 may be connected to the signal conditioning circuitry 282. An output of the signal conditioning circuitry 282 may be connected to the filter 284. The filter 284 may be configured as a bandpass filter that may include a second passband. The second passband may, for example and without limitation, include about 4 KHz to about 10 KHz. An output of the filter 284 may be connected to the inverting amplifier 286. An output of the inverting amplifier 286 may be connected to the demodulator 288. An output of the demodulator 288 may be connected to the GFCU 110A and/or to the threshold comparator 290. An output of the threshold comparator 290 may be connected to a timer circuit 292. An output of the timer circuit 292 may be connected to an input of the GFCU 110A. The GFCU 110A may process information from the demodulator 288 and/or the timer circuit 292 and may determine if the content of the second portion 280 indicates the presence of a ground fault.

In embodiments, the GFCU 110A may be configured to receive an input (e.g., user input) to set a threshold of the threshold comparator 290. The GFCU 110A may set the threshold according to the input. Additionally or alternatively, a default threshold may be provided, such as via a potentiometer 294.

With embodiments, the second portion 280 may be connected to an HF current sensor 238 in addition to and/or instead of the LF current sensor 236 that may be connected to the first portion 260 (e.g., the second portion 280 may be part of the HF GFD circuit 350).

In embodiments, such as generally illustrated in FIG. 10, an HF GFD circuit 350 may include a first portion 380 and/or a second portion 480. The first portion 380 may be configured to detect ground faults in a third range of frequencies, such as about 20 KHz to about 50 Hz. The second portion 480 may be configured to detect ground faults in a fourth range of frequencies, such as about 150 KHz to about 350 KHz. With embodiments, the first portion 380 and the second portion 480 of the HF GFD circuit 350 may be configured in a similar manner as the second portion 280 of the LF GFD circuit 250, except for the configuration of the filters. For example and without limitation, the first portion 380 and the second portion 480 may each include signal conditioning circuitry 382, 482, a filter 384, 484, an inverting amplifier 386, 486, a demodulator 388, 488 (e.g., a radio frequency or RF demodulator), a threshold compara-tor 390, 490, and/or a timer circuit 392, 492. The filter 384 of the first portion 380 may include a third passband that may, for example, include about 20 KHz to about 50 Hz. The filter 484 of the second portion 480 may include a fourth passband that may, for example, include about 150 KHz to about 350 KHz. The GFCU 110A may be configured to receive an input (e.g., user input) to set thresholds of the threshold comparators 390, 490. The GFCU 110A may set the thresholds according to the input. Additionally or alternatively, default thresholds may be provided, such as via potentiometers 394, 494.

With embodiments, the demodulators 288, 388, 488 may be configured to reduce the frequency of the incoming signal (e.g., from the HF current sensor 238), which may facilitate comparing the incoming signal to the threshold and/or the GFCU 110A analyzing the output of the first GFD unit 110. Such a configuration may allow an electrical system 100 to detect a high frequency ground fault without using digital signal processing and Fourier transforms that may involve complex calculations and/or powerful processors. For example and without limitation, the first GFD unit 110 may be configured to process the output of a current sensor 238 via hardware/circuitry (e.g., analog processing) instead of the GFCU 110A or the ECU 104 performing complex calculations.

With embodiments, one or more of the filters 264, 284, 384, 484 may, for example and without limitation, be configured as a Sallen-Key bandpass filter.

Figure 11:
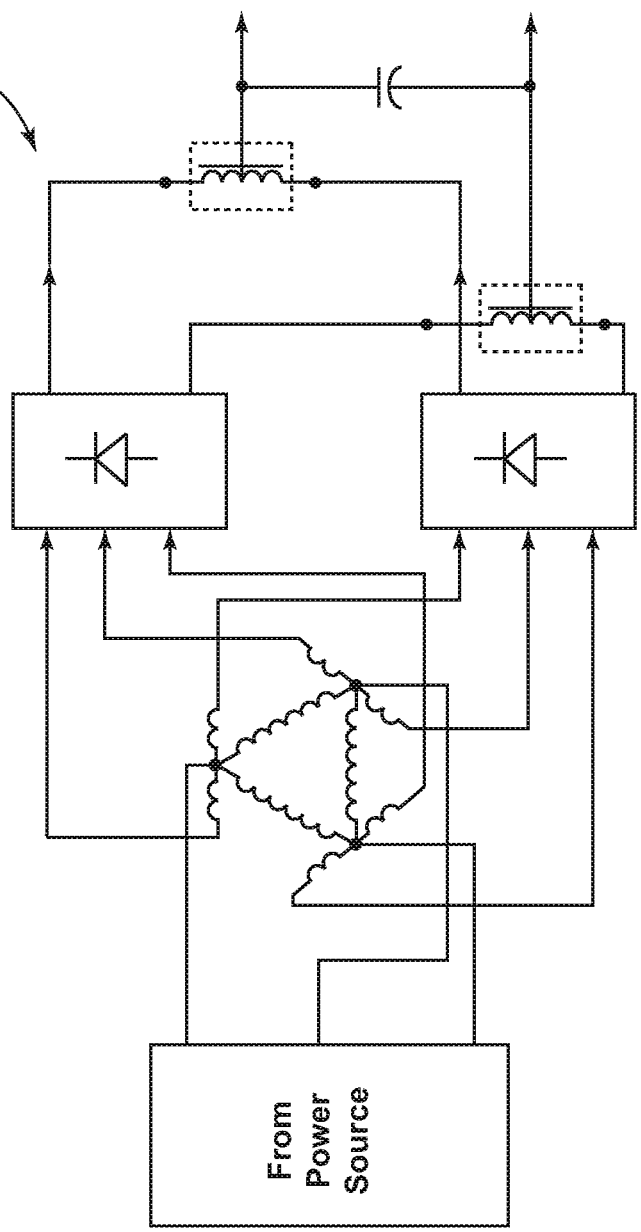
FIG. 11 is a schematic view generally illustrating an embodiment of a transformer rectifier unit according to teachings of the present disclosure.
Figure 12:
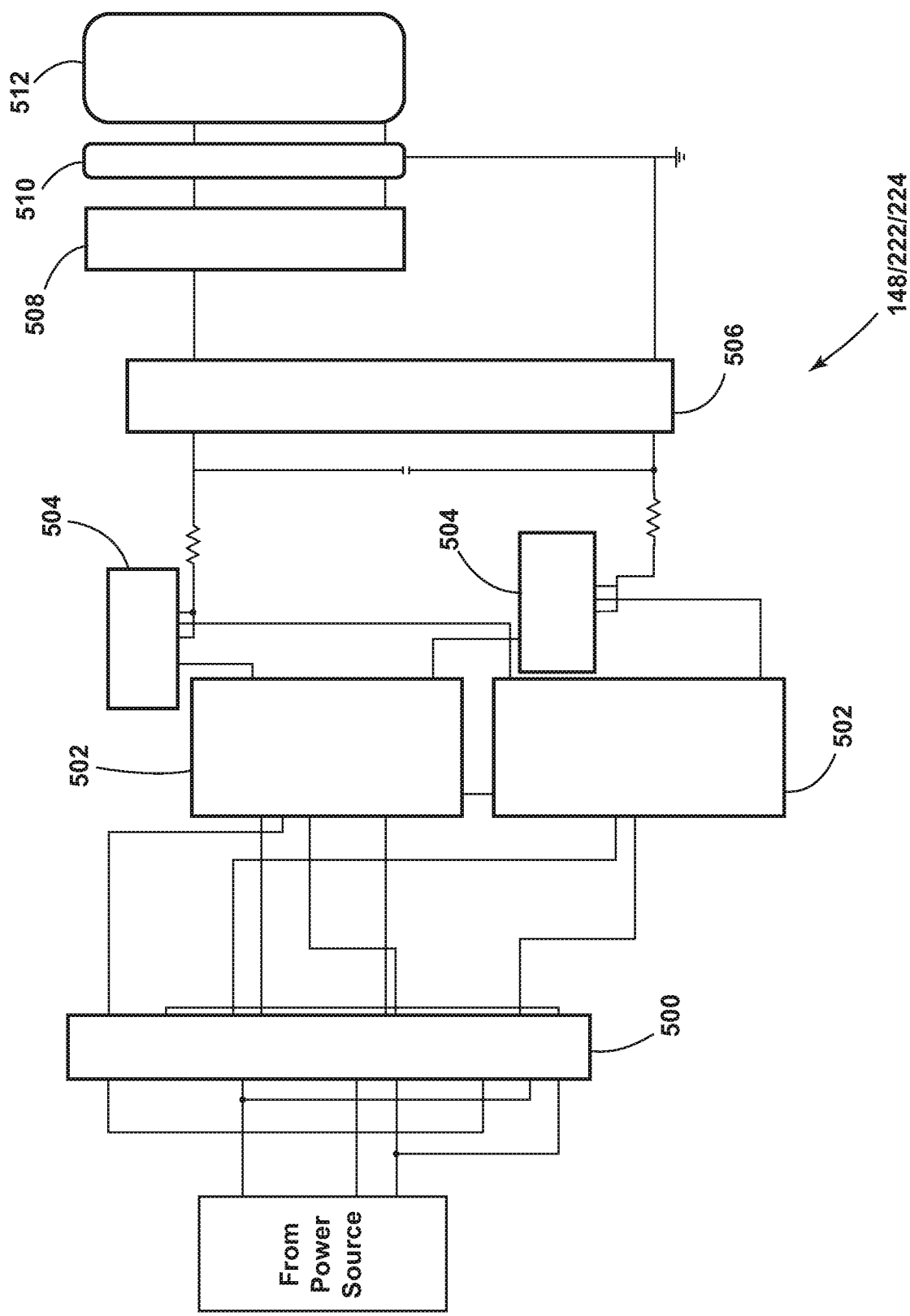
FIG. 12 is a schematic view generally illustrating an embodiment of a transformer rectifier unit according to teachings of the present disclosure.

In embodiments, such as generally illustrated in FIGS. 1 and 7, an AC voltage may be generated via the power source 102 (e.g., a variable AC supply) and the AC voltage may be converted to a DC voltage via an auto-transformer rectifier unit (ATRU) 148, 222, 224. The ATRU 148, 222, 224 may enable significant weight reduction relative to other AC/DC conversion configurations. FIGS. 11 and 12 generally illustrate example architectures and internal blocks of an ATRU 148, 222, 224. As generally illustrated in FIG. 12, an ATRU 148, 222, 224 may include an auto-transformer 500 (e.g., a 12-pulse auto-transformer), a rectifier 502, interphase reactors 504, a differential mode choke 506, a bulk capacitor 508, and/or load capacitors 510, and may be connected to a load 512. An electrical system 100 may be configured for wide and/or dynamic range measurement, such as for DC and/or high frequency faults that may result, at least in part, from an ATRU 148, 222, 224.

Figure 13:
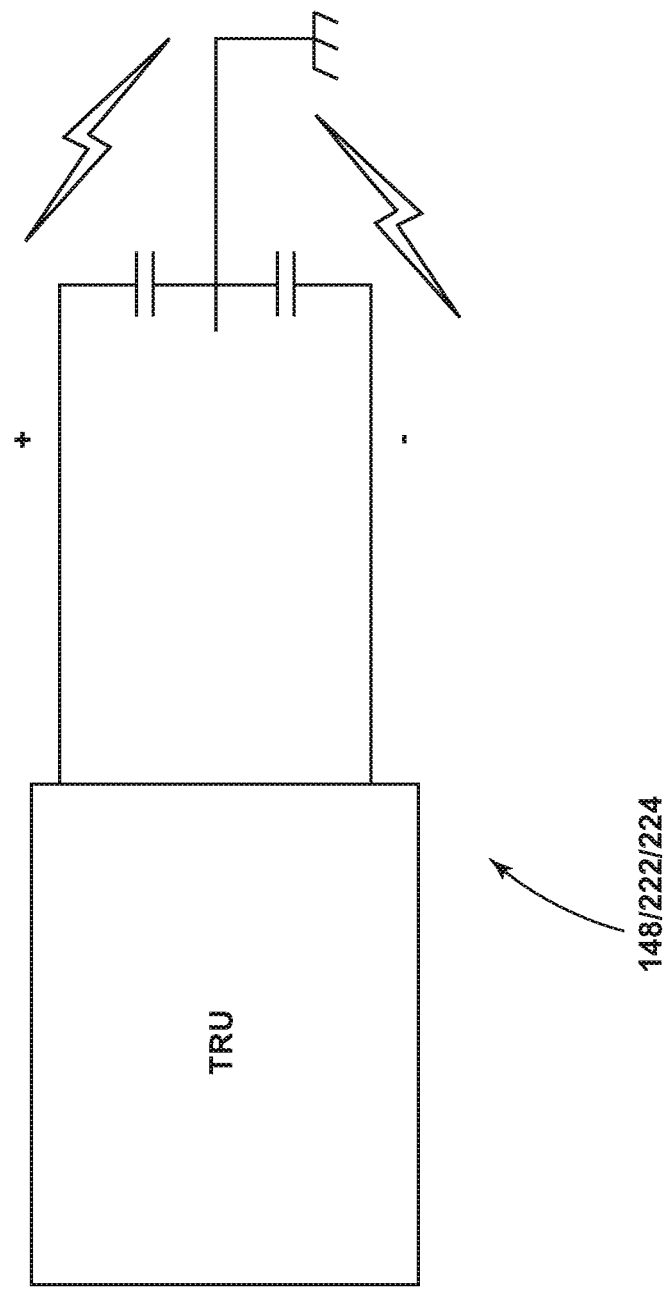
FIG. 13 is a schematic representation generally illustrating ground faults associated with an embodiment of a transformer rectifier unit (TRU) according to teachings of the present disclosure.
Figure 14:
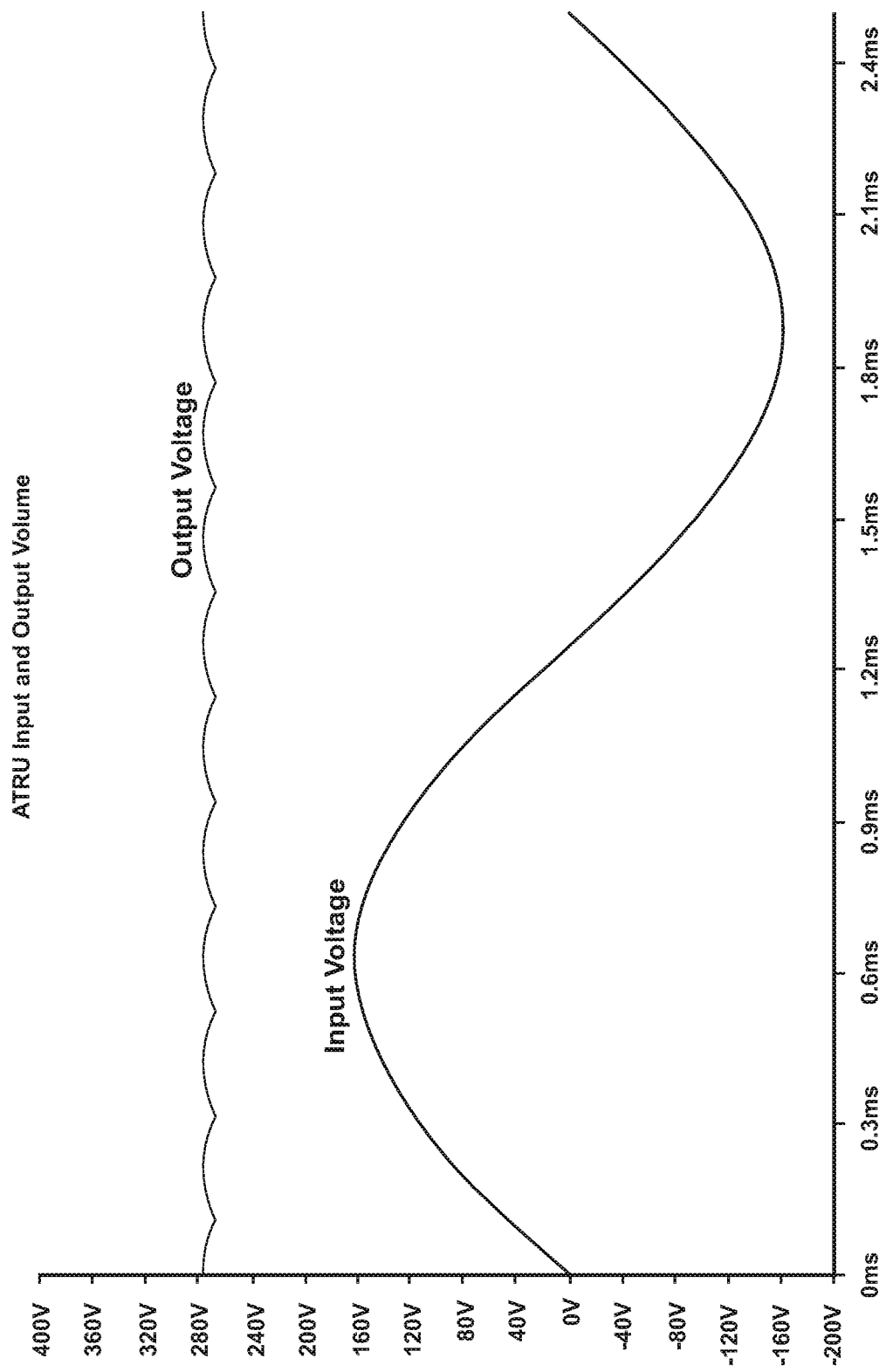
FIG. 14 is a graphical view of input and output voltages of an embodiment of a transformer rectifier unit of an electrical system according to teachings of the present disclosure.
Figure 15:
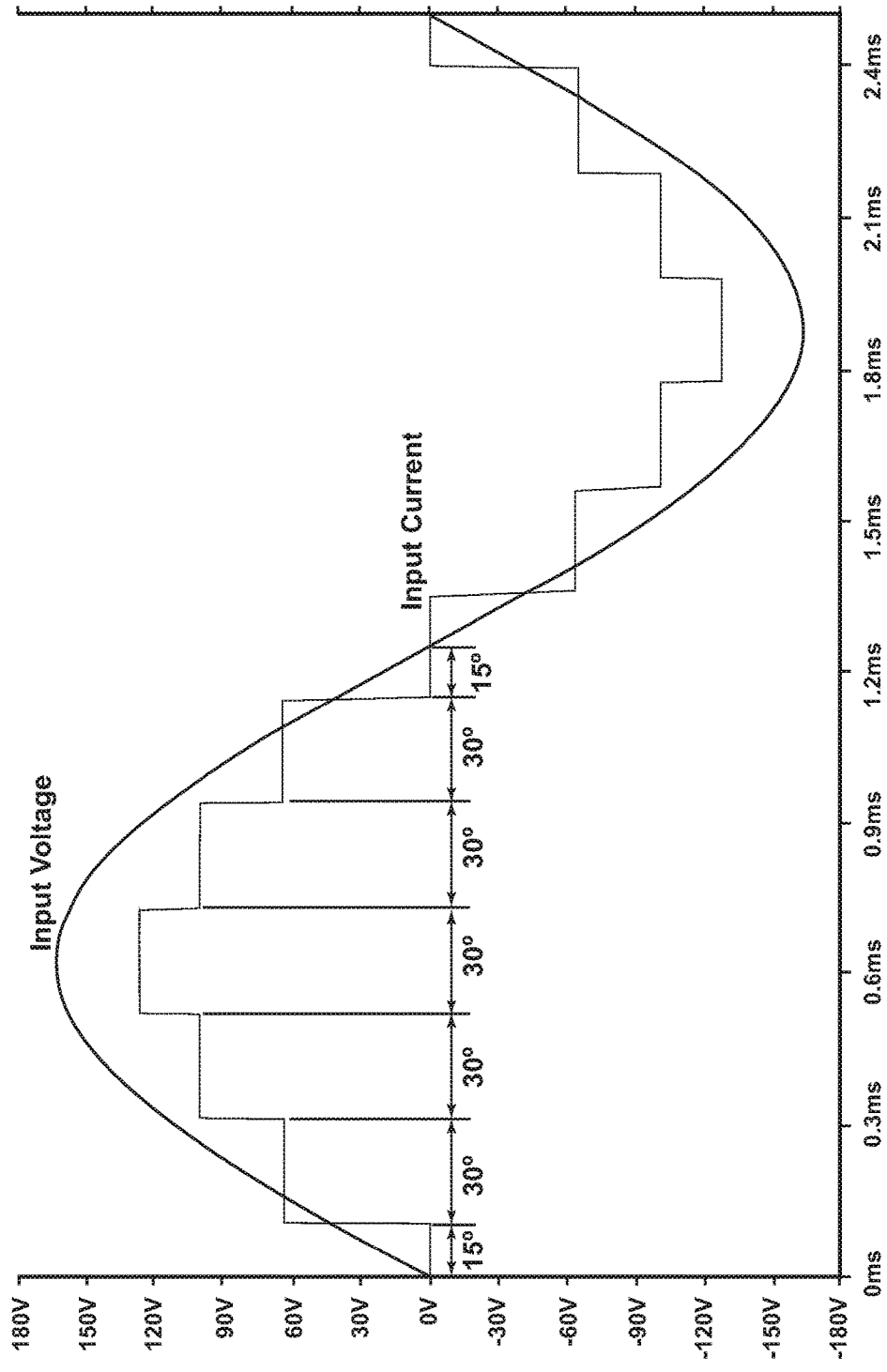
FIG. 15 is a graphical view of input voltage and input current of an embodiment of a transformer rectifier unit of an electrical system according to teachings of the present disclosure.
Figure 17:
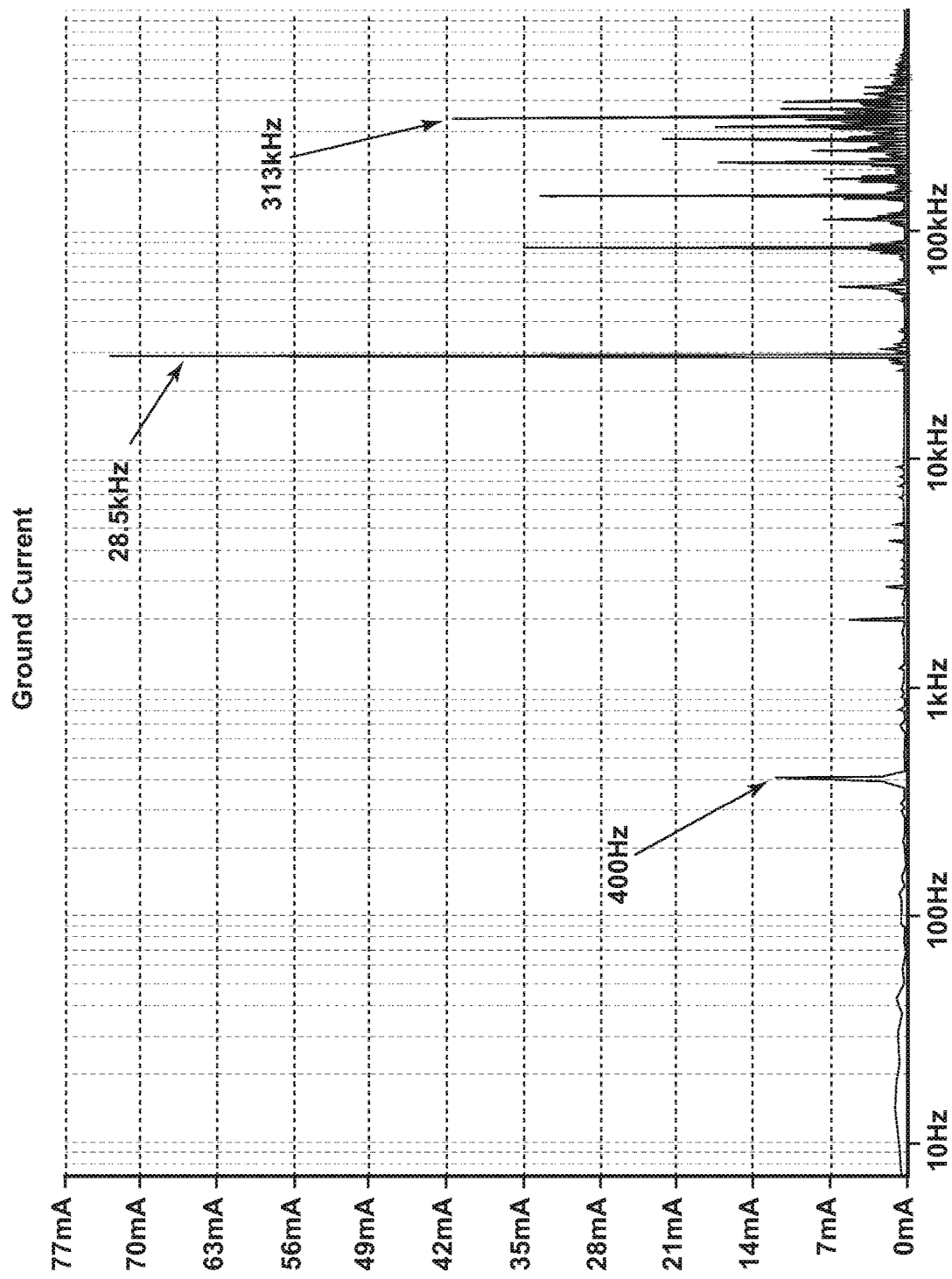
FIG. 17 is a graphical view of frequencies of ground current in an embodiment of an electrical system according to teachings of the present disclosure.

In embodiments, an output of a TRU/ATRU and a filter for 3 phase 115 V AC supply may be about +/270 V DC (see, e.g., FIGS. 14 and 15). A ground fault in a TRU-based DC system can occur because of positive to ground and/or negative to ground conduction (see, e.g., FIG. 13). Typical/conventional GFD systems may rely on a 150-200% over-current trip, which may be due to low impedance of the ground. These conventional systems may be insensitive to high frequency currents (see, e.g., FIG. 17), which can be of low amplitude but can cause structural damage, such as to bearings of a motor, at least over periods of time. Conventional current sensors may not provide a wide dynamic range.

Figure 16:
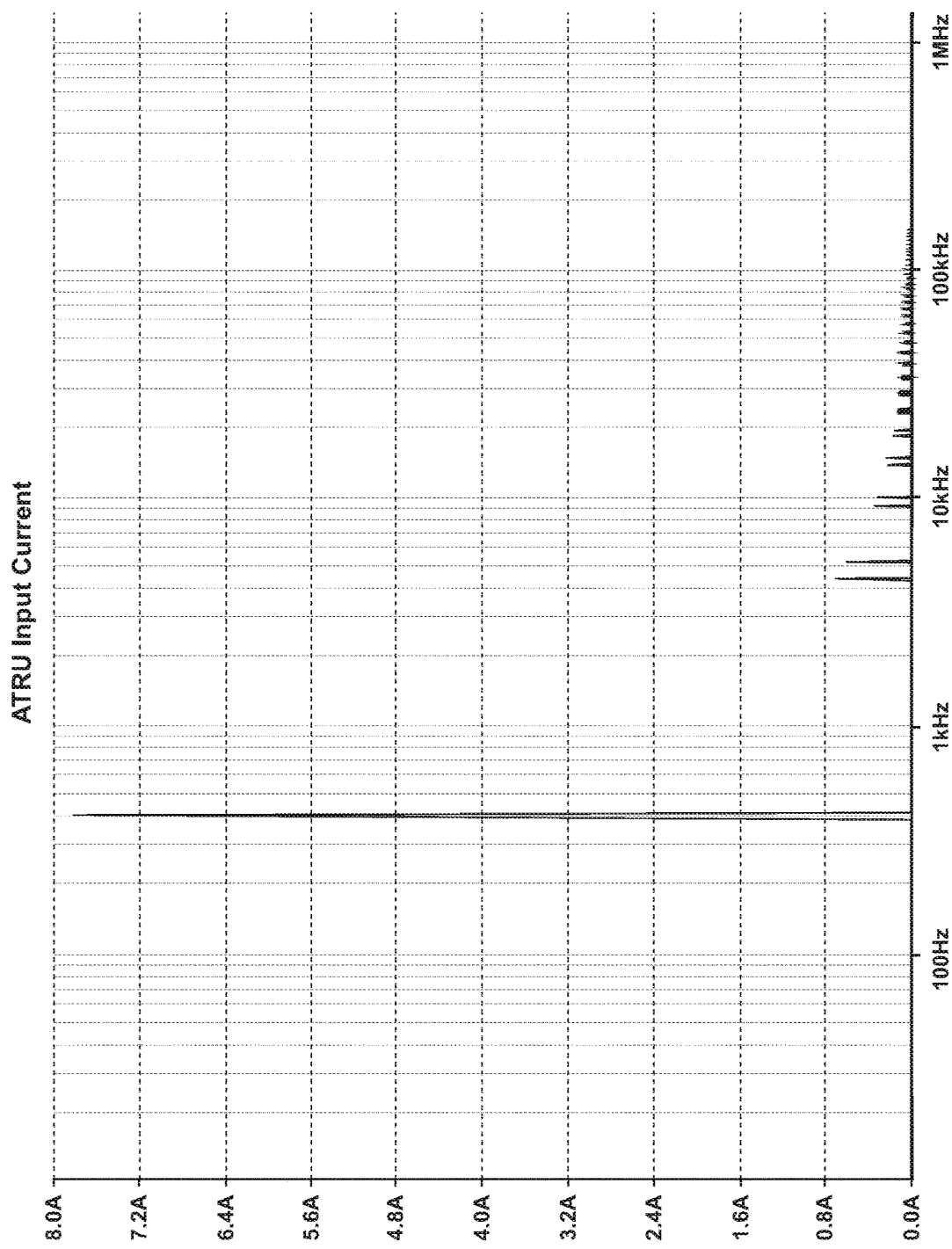
FIG. 16 is a graphical view of a harmonic spectrum of input current of an embodiment of a transformer rectifier unit of an electrical system according to teachings of the present disclosure.

In some circumstances, such as generally illustrated in FIG. 16, the next peak after fundamental may be at or about 11 times the supply frequency. A leakage/ground current due to an ATRU 148, 222, 224 may also be at or about 11 times the input frequency, for example.

In embodiments, DC loads may be connected to a TRU/ATRU and may involve switching converters. With embodiments, an electrical system 100 may incorporate and/or be configured to implement design techniques and solutions to limit damage from ground faults. A GFD unit 110, 120 at/near the power source 102 and/or at the load side of the electrical system 100 may include a separate floating return and may be made capable of detecting wideband DC ground faults. DC ground faults may have fixed low frequency DC and/or high frequency switching current.

Figure 18:
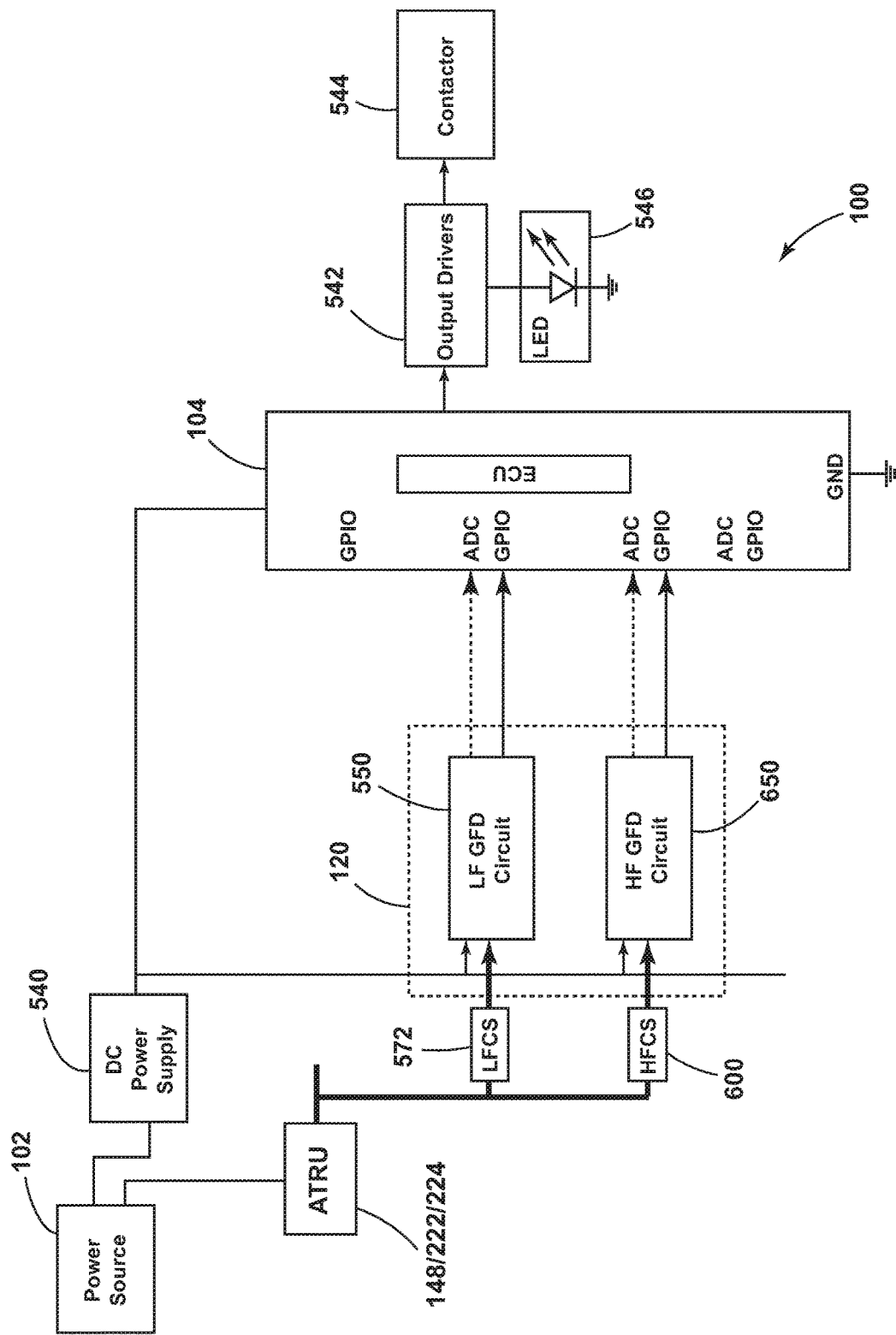
FIG. 18 is a schematic view generally illustrating portions of an embodiment of an electrical system, including a low frequency ground fault detection circuit and a high frequency detection circuit, according to teachings of the present disclosure.
Figure 19:
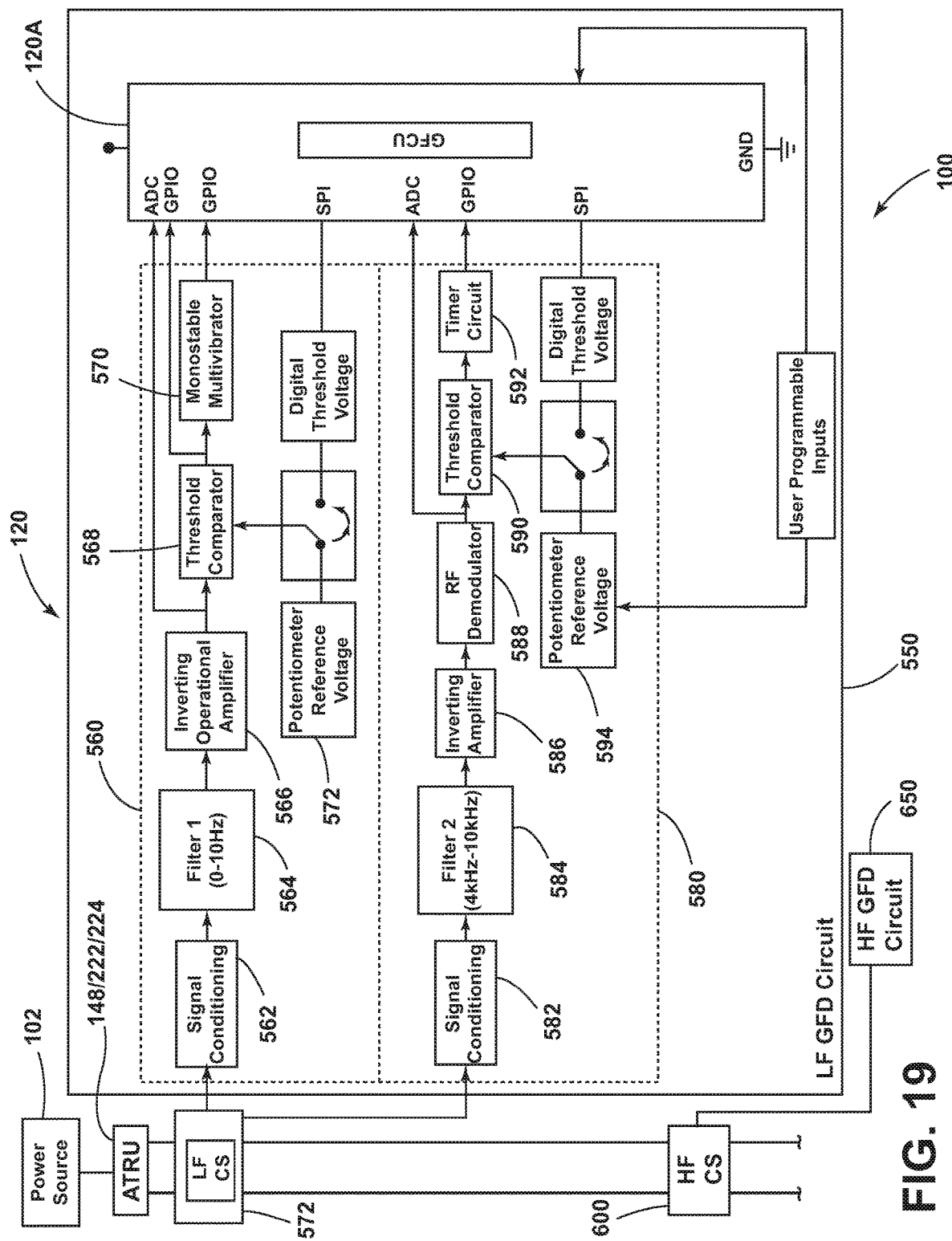
FIG. 19 is a schematic view generally illustrating portions of an embodiment of an electrical system including a low frequency ground fault detection circuit according to teachings of the present disclosure.

An embodiment of an electrical system 100 (e.g., a GFD system) is generally illustrated in FIG. 18 and may include a second GFD unit 120, a DC power supply 540, a GFCU 120A, output drivers 542, and/or one or more outputs, such as a contactor interface 544 and/or one or more LEDs (light emitting diodes) 546, for example and without limitation. The DC power supply 540 may provide power to the second GFD unit 120. The GFCU 120A may be connected to and/or configured to control the second GFD unit 120 and/or the output drivers 542. The output drivers 542 may drive the outputs 244, 546. The second GFD unit 120 may include an LF GFD circuit 550 and/or an HF GFD circuit 650. An embodiment of an LF GFD circuit 550 is generally illustrated in FIG. 19. An embodiment of an HF GFD circuit 650 is generally illustrated in FIG. 20.

With embodiments, such as generally illustrated in FIG. 19, an LF GFD circuit 550 may include a first portion 560 and/or a second portion 580. The first portion 560 may be configured to detect ground faults in a first range of frequencies, such as about 0 Hz to about 10 Hz. The first portion 560 may include a configuration that may be similar to the first portion 260 of the LF GFD circuit 250 of the first GFD unit 110 described in connection with FIG. 9. For example and without limitation, the first portion 560 of the LF GFD circuit 550 may include signal conditioning circuitry 562, a filter 564, a rectifier and peak detector 566 (e.g., a precision rectifier and peak detector), and/or a zero-crossing detector 568. The first portion 560 may include a monostable multivibrator 570. The filter 564 may be configured as a low pass filter that may include a cutoff frequency of about 10 Hz or less (or more). An LF current sensor 572 may be connected at or about an output of a TRU/ATRU (e.g., ATRU 148, 222, or 224) and may be connected to the signal conditioning circuitry 562.

With embodiments, the second portion 580 may be configured to detect ground faults in a second range of frequencies, such as about 4 KHz to about 10 KHz. The second portion 580 may be configured in the same or a similar manner as the second portion 280 of the LF GFD circuit 250 of the first GFD unit 110 described in connection with FIG. 9. For example and without limitation, the second portion 580 of the LF GFD circuit 550 may include signal conditioning circuitry 582, a filter 584, an inverting amplifier 586, a demodulator 588 (e.g., a radio frequency or RF demodulator), a threshold comparator 590, and/or a timer circuit 592. An output of the LF current sensor 572 may be connected to the signal conditioning circuitry 582. The filter 584 may be configured as a bandpass filter that may include a first passband. The first passband may, for example and without limitation, include about 4 KHz to about 10 KHz. With embodiments, the second portion 580 may be connected to an HF current sensor 600 in addition to and/or instead of the LF current sensor 572 that may be connected to the first portion 560. The GFCU 120A may be configured to receive input (e.g., user input) to set thresholds of the threshold comparator 590. The GFCU 120A may set the thresholds according to the input. Additionally or alternatively, default thresholds may be provided, such as via a potentiometer 594.

Figure 20:
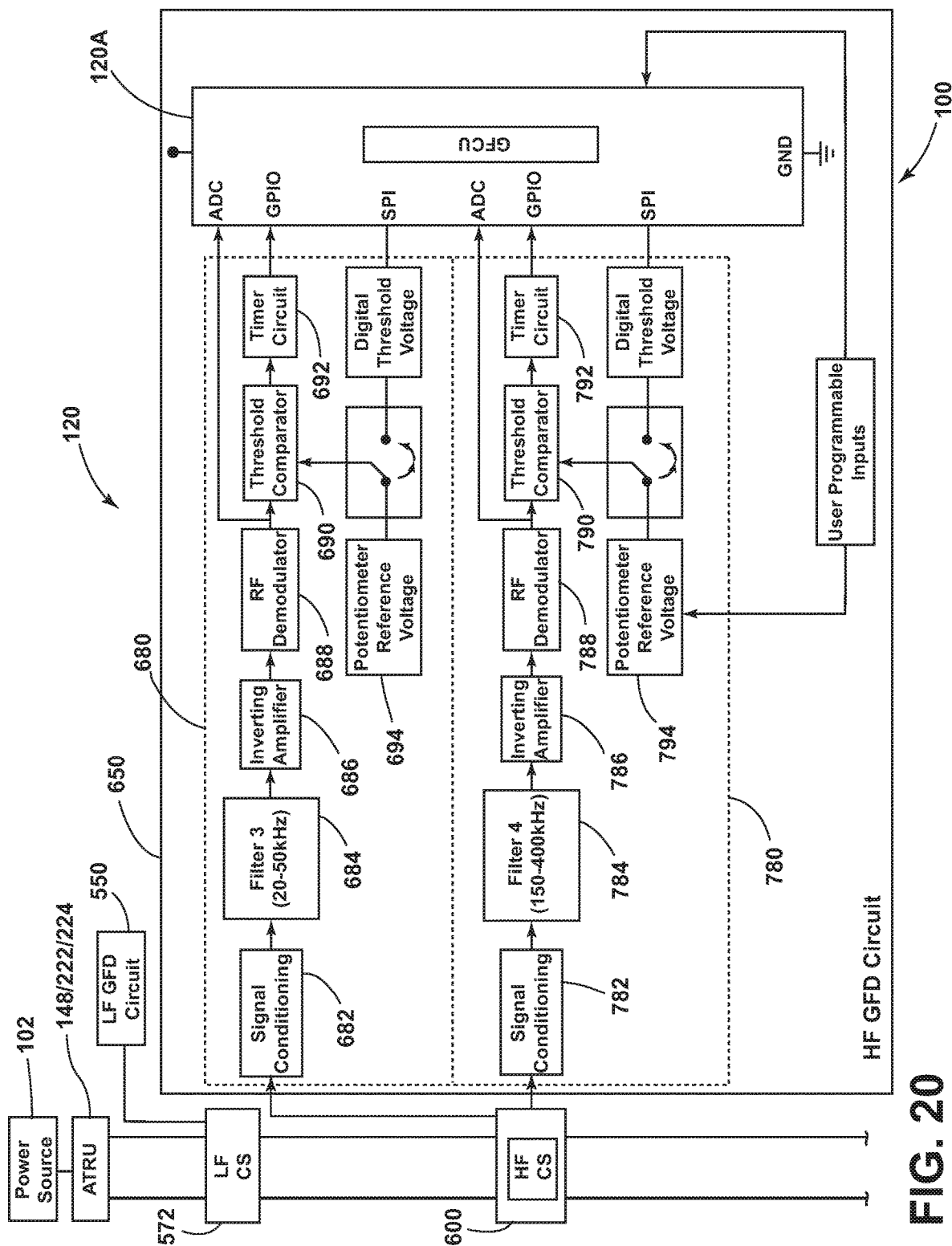
FIG. 20 is a schematic view generally illustrating portions of an embodiment of an electrical system including a high frequency ground fault detection circuit according to teachings of the present disclosure.

In embodiments, such as generally illustrated in FIG. 20, an HF GFD circuit 650 may include a first portion 680 and/or a second portion 780. The first portion 680 may be configured to detect ground faults in a third range of frequencies, such as about 20 KHz to about 50 Hz. The second portion 780 may be configured to detect ground faults in a fourth range of frequencies, such as about 150 KHz to about 400 KHz. With embodiments, the first portion 680 and the second portion 780 of the HF GFD circuit 650 may be configured in the same or a similar manner as the first portion 380 and the second portion 480, respectively, of the HF GFD circuit 350 of the first GFD unit 110 described in connection with FIG. 10. For example and without limitation, the first portion 680 and the second portion 780 may each include signal conditioning circuitry 682, 782, a filter 684, 784, an inverting amplifier 686, 786, a demodulator 688, 788 (e.g., a radio frequency or RF demodulator), a threshold comparator 690, 790, and/or a timer circuit 692, 792. The filter 684 of the first portion 680 may include a second passband that may, for example, include about 20 KHz to about 50 Hz. The filter 784 of the second portion 780 may include a third passband that may, for example, include about 150 KHz to about 350 KHz. The GFCU 120A may be configured to receive input (e.g., user input) to set thresholds of the threshold comparators 690, 790. The GFCU 120A may set the thresholds according to the input. Additionally or alternatively, default thresholds may be provided, such as via potentiometers 694, 794.

With embodiments, the demodulators 588, 688, 788 may be configured to reduce the frequency of the incoming signal (e.g., from the HF current sensor 600), which may facilitate comparing the incoming signal to the threshold. Such a configuration may allow an electrical system 100 to detect a high frequency ground fault without using of digital signal processing and Fourier transforms that may involve complex calculations and/or powerful processors.

In embodiments, such as generally illustrated in FIGS. 10 and 20, an output of an HF current sensor 238, 600 may be conditioned and passed through respective band pass filters (e.g., filters 284, 384, 484, 584, 684, 784). These filters may be tuned for different ranges of frequency spectrum. The bandwidth of these band pass filters may be determined by analyzing the fault waveforms. The output of the HF band pass filters may be rectified and integrated to create envelopes that may be compared with set thresholds. The output may be stabilized by a monostable multi vibrator and then transferred to the input port of the GFCU 120A. A signal transition on this input port may indicate that the HF envelope has crossed the threshold and further processing may be initiated.

In embodiments, one or more of the filters 584, 684, 784 may, for example and without limitation, be configured as a Sallen-Key bandpass filter.

Figure 21:
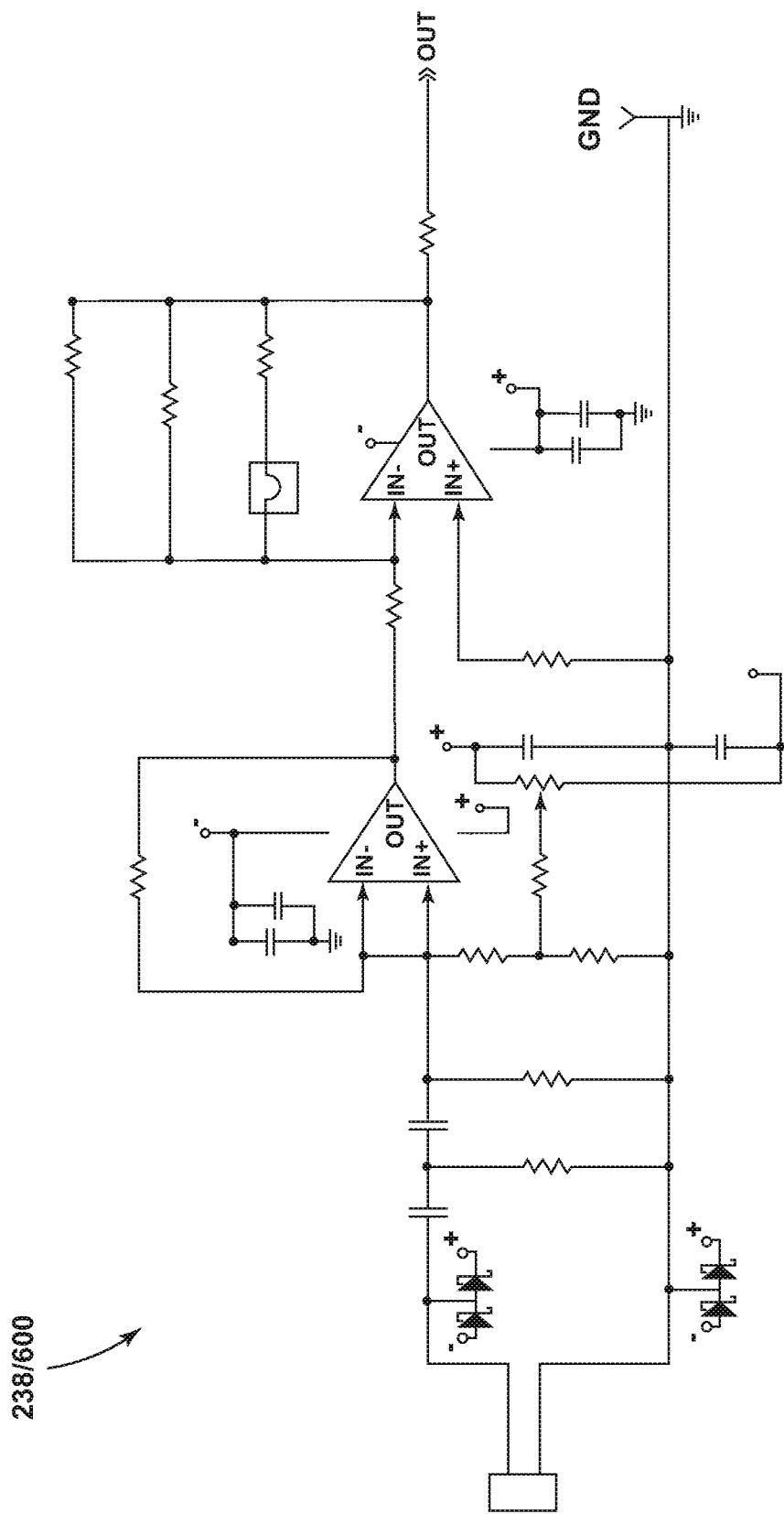
FIG. 21 is a schematic view generally illustrating portions of an embodiment of a current sensor according to teachings of the present disclosure.
Figure 22:
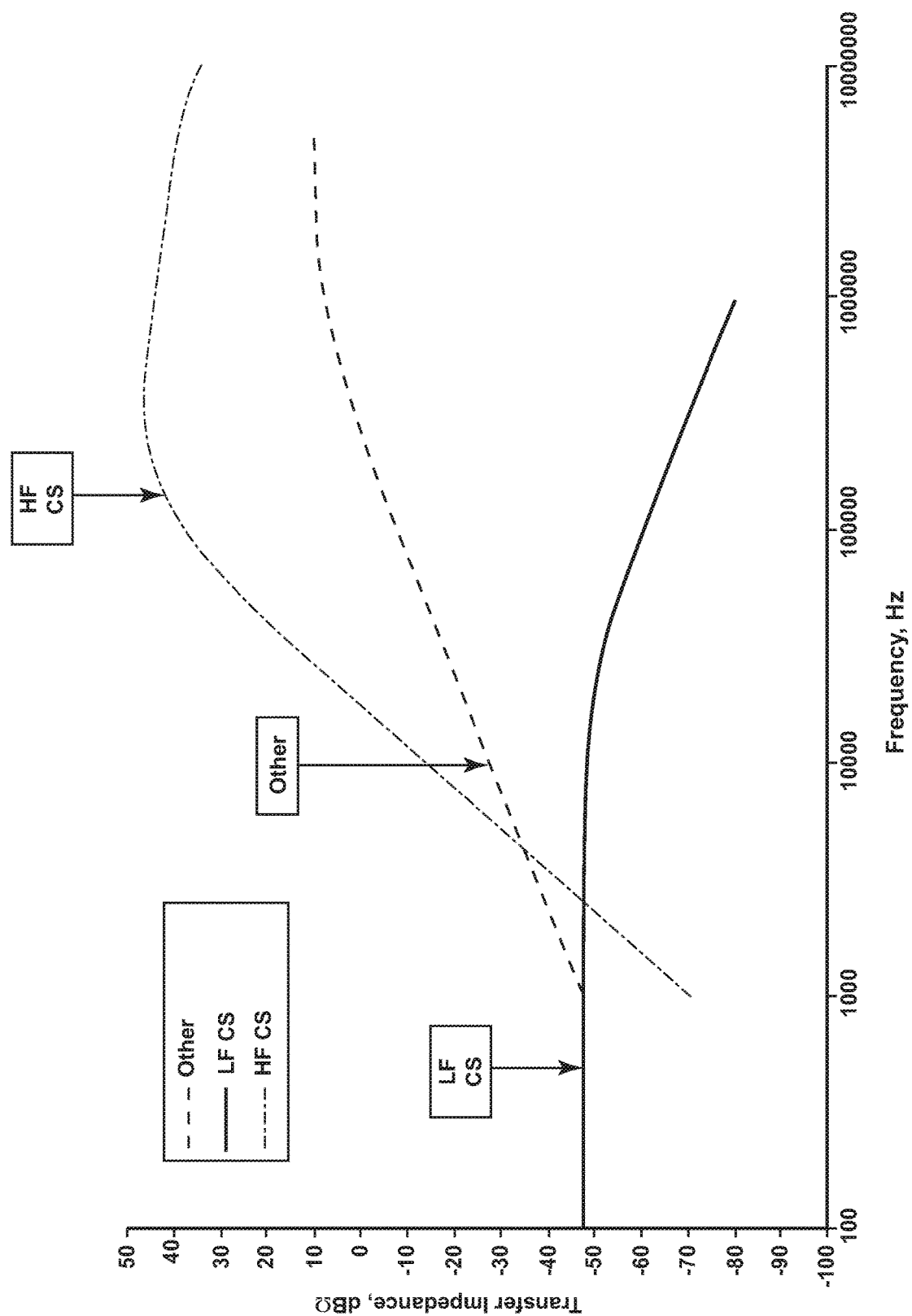
FIG. 22 is a graphical view of the impedance and frequency of various current sensors, including an embodiment of a current sensor according to teachings of the present disclosure.

With embodiments, such as generally illustrated in FIGS. 8, 10, 18 and 20, an electrical system 100, may include an HF current sensor 238, 600 (e.g., an HF current transformer). An example of an HF current sensor 238, 600 is generally illustrated in FIG. 21. As generally illustrated in FIG. 22, an HF current sensor 238, 600 may be configured for sensing currents with frequencies of about 20 kHz up to 10 MHz, for example and without limitation. An HF current sensor 238, 600 may include two parts, such as a current transformer and a precisely tuned and matched amplifier circuit. Ground current noise may be relatively low at high frequencies, the HF current sensor (HF CS) may include a bigger gap core (e.g., model 58257A2). Such a sensor 238, 600 may include a variable gain and may not saturate at high currents. The HF current sensor 238, 600 may provide better performance than other sensors. Performance of an LF current sensor 236 may decline around 1 kHz and may decline significantly around 10 kHz.

With embodiments, electrical systems 100 may be configured to detect ground faults and may use one or more components/hardware of existing arc fault circuit breakers, such as those described in commonly owned patents U.S. Pat. Nos. 9,612,267, 9,768,605, 9,797,940, 9,797,941, and 8,218,274, the disclosures of which are hereby incorporated by reference in their entireties. In embodiments, electrical systems 100 may provide reliable ground fault detection over a wide frequency range.

In embodiments, a method of operating an electrical system 100 may include operating a power source 102 to provide an AC voltage to a load 106 and/or a transformer rectifier unit, such an ATRU 148, 222, 224. The method may include detecting ground fault current via a first GFD unit 110 and/or a second GFD unit 120. The first GFD unit 110 may be connected to an output of the power source 102. The second GFD 120 unit may be connected to an output of the ATRU 148, 222, 224. An ECU 104 may be connected to the first GFD unit 110 and/or the second GFD unit 120. The ECU 104 may be configured to monitor the first GFD unit 110 and/or the second GFD unit 120 over time. For example and without limitation, the ECU 104 may be configured to indicate a ground fault if the first GFD unit 110 and/or the second GFD unit 120 detects ground current for a period of time. An amplitude threshold for the ground current may be lower than other ground fault detection systems, which may permit the electrical system 100 to detect higher frequency and lower amplitude ground fault currents that may damage components over time (even if such ground current is not an immediate risk). For example and without limitation, a threshold of high frequency ground current may be about 1 A or less, about 500 mA or less, or other values.

With embodiments, an electrical system 100 may include a first threshold for low frequency ground current (e.g., 1 kHz or less) and/or may include a second threshold for high frequency ground current (e.g., greater than 1 kHz). The second threshold may be lower than the first threshold. A first time period (e.g., how long the threshold value may be sensed before detecting a fault) may be associated with the first threshold and a second time period may be associated with the second threshold. The second period may be longer than the first threshold. The second period may, for example and without limitation, be at least one second, at least one minute, and/or at least one hour, among other greater and lesser values. The first period may, for example and without limitation, be less than one minute, less than one second, and/or less than half of one second, among other greater and lesser values.

Embodiments of electrical systems 100 may be configured for high frequency ground fault detection for MEA Loads, such as PMSM (permanent magnet synchronous motor) motor controllers and/or VFDs (variable frequency drives), among others. Embodiments of electrical systems 100 may be configured to limit and/or avoid component failure, such as bearing failures for motors and generators. Embodiments of electrical systems 100 may enable detection of ground faults of transformer rectifier units, such as of multi-pulse auto-transformers. Embodiments of electrical systems 100 may not require FFT-based complex higher end microcontroller processing, DSP (digital signal processing), and/or FPGA (field programmable gate array) processing. Embodiments of electrical systems 100 may be utilized in connection with carbon composite aircraft. Embodiments of electrical systems 100 may include one or more components common with arc fault detectors. Embodiments of electrical systems 100 may be configured to compensate for and/or avoid saturation by high amplitude AC or DC over current faults (e.g., after clearing a DC ground fault, an AC ground fault may still be detected). Embodiments of electrical systems 100 may provide the option not to trip for high frequency ground current and may be configured to avoid an aliasing effect or nuisance tripping, which might otherwise be caused by high frequency getting demodulated and detected as low frequency.

In embodiments, an ECU (e.g., ECU 104, GFCU 110A, GFCU 120A) may include an electronic controller and/or include an electronic processor, such as a programmable microprocessor and/or microcontroller. In embodiments, an ECU may include, for example, an application specific integrated circuit (ASIC). An ECU may include a central processing unit (CPU), a memory (e.g., a non-transitory computer-readable storage medium), and/or an input/output (I/O) interface. An ECU may be configured to perform various functions, including those described in greater detail herein, with appropriate programming instructions and/or code embodied in software, hardware, and/or other medium. In embodiments, an ECU may include a plurality of controllers. In embodiments, an ECU may be connected to a display, such as a touchscreen display.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

It should be understood that an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method of monitoring an electrical system, the method comprising:
providing a ground fault detection unit including:
a microcontroller;
a first ground fault detection circuit including a first portion and a second portion, the first portion and the second portion each connected to a first current sensor at respective inlets and to the microcontroller at respective outlets of the first and second portions; and
a second ground fault detection circuit including a first portion and a second portion, the first portion and the second portion each connected to a second current sensor at respective inlets and to the microcontroller at respective outlets of the first and second portions;
operating a transformer rectifier unit to provide DC power to a load;
sensing, via the first current sensor, a ground current at or about an output of the transformer rectifier unit; and
monitoring a sensor output from the first current sensor via the ground fault detection unit;
wherein the ground fault detection unit is configured to detect ground faults at frequencies of at least 30 kHz; and
wherein the first current sensor is configured as a high-frequency current sensor and the second current sensor is a low-frequency current sensor.

2. The method of claim 1, wherein the ground fault detection unit is configured to detect ground faults at frequencies of at least 100 kHz.

3. The method of claim 1, including sensing, via the second current sensor, the ground current;
wherein the first portion of the first ground fault detection circuit, the second portion of the first ground fault detection circuit, the first portion of the second ground fault detection circuit, and the second portion of the second ground fault detection circuit include respective filters.

4. The method of claim 3, wherein the first current sensor is not a Hall Effect sensor; and the second current sensor is a Hall Effect sensor.

5. The method of claim 1, wherein for the first ground fault detection circuit and/or the second ground fault detection circuit, the respective first portion and the respective second portion are separate and each includes separate electrical components configured to condition, filter, and/or amplify the sensor output from the respective current sensor.

6. The method of claim 5, wherein the separate electrical components for each of the first portion and the second portion include signal conditioning circuitry, a filter, an inverting amplifier, a demodulator, a threshold comparator, and/or a timer circuit.

7. The method of claim 1, including detecting a ground fault if the ground current exceeds a first threshold or a second threshold;
wherein the first threshold is a low frequency current threshold and the second threshold is a high frequency current threshold.

8. The method of claim 7, wherein the second threshold is lower than the first threshold.

9. The method of claim 6, wherein detecting the ground fault includes detecting the ground fault if the ground current exceeds the first threshold for a first period of time or if the ground current exceeds the second threshold for a second period of time.

10. The method of claim 9, wherein the second period of time is longer than the first period of time.

11. The method of claim 6, wherein the ground fault corresponds to ground current with a frequency of at least 25 kHz; and detecting the ground fault includes detecting the ground fault without a Fourier transform.

12. The method of claim 1, wherein the first portion of the second ground fault detection circuit includes a demodulator configured to reduce a frequency of an output of the second current sensor.

13. The method of claim 1, wherein the first portion of the first ground fault detection circuit includes a monostable multivibrator.

14. An electrical system, comprising:
a ground fault detection unit, including:
 a microcontroller;
 a first ground fault detection circuit including a first portion and a second portion, the first portion and the second portion each connected to a first current sensor at respective inlets and to the microcontroller at respective outlets of the first and second portions; and
 a second ground fault detection circuit including a first portion and a second portion, the first portion and the second portion each connected to a second current sensor at respective inlets and to the microcontroller at respective outlets of the first and second portions;
wherein the first current sensor and the second current sensor are configured to sense current at or about an output of a DC power supply; and
wherein the first portion of the second ground fault detection circuit includes a demodulator configured to reduce a frequency of an output of the second current sensor.

15. The electrical system of claim 14, including a second ground fault detection unit including a third ground fault detection circuit and a fourth ground fault detection circuit; the second ground fault detection unit is connected to an AC power supply; and the DC power supply is connected to the AC power supply and configured to convert AC power from the AC power supply to DC power for a variable frequency drive connected to an electric motor.

16. An electrical system, comprising:
a ground fault detection unit, including:
 a first ground fault detection circuit including a first portion and a second portion, the first portion and the second portion connected to a first current sensor; and
 a second ground fault detection circuit including a first portion and a second portion, the first portion and the second portion connected to a second current sensor;
wherein the first current sensor and the second current sensor are configured to sense current at or about an output of a DC power supply; and
wherein the first portion of the first ground fault detection circuit includes a low pass filter having a cutoff frequency; the second portion of the first ground fault detection circuit includes a first bandpass filter with a first passband; the first portion of the second ground fault detection circuit include a second bandpass filter with a second passband; and the second portion of the second ground fault detection circuit includes a third bandpass filter with a third passband.

17. The electrical system of claim 16, wherein the third passband includes higher frequencies than the second passband; the second passband includes higher frequencies than the first passband; and the first passband includes frequencies above the cutoff frequency.

18. The electrical system of claim 16, wherein the DC power supply is a transformer rectifier unit; the first passband corresponds to the DC power supply; the second passband corresponds to switching frequencies; and the third passband corresponds to harmonics of the switching frequencies.

19. The electrical system of claim 17, wherein a maximum frequency of the third passband is at least about 100 kHz and a maximum frequency of the second passband is at least about 20 kHz.

20. The electrical system of claim 19, wherein a maximum frequency of the second passband is at least about 4 kHz; and the cutoff frequency is about 10 Hz or less.

* * * * *